(12) United States Patent
Nishi et al.

(10) Patent No.: US 10,355,084 B1
(45) Date of Patent: Jul. 16, 2019

(54) SEMICONDUCTOR DEVICE, METHOD OF MANUFACTURING THE SAME AND POWER CONVERSION DEVICE

(71) Applicant: Mitsubishi Electric Corporation, Tokyo (JP)

(72) Inventors: Koichi Nishi, Tokyo (JP); Kenji Suzuki, Tokyo (JP); Tetsuo Takahashi, Tokyo (JP); Junichi Yamashita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/115,598

(22) Filed: Aug. 29, 2018

(30) Foreign Application Priority Data

Feb. 27, 2018 (JP) .................................. 2018-033692

(51) Int. Cl.
*H01L 29/06* (2006.01)
*H01L 29/739* (2006.01)
(Continued)

(52) U.S. Cl.
CPC ........ *H01L 29/0696* (2013.01); *H01L 21/304* (2013.01); *H01L 21/78* (2013.01); *H01L 23/34* (2013.01); *H01L 23/544* (2013.01); *H01L 29/401* (2013.01); *H01L 29/404* (2013.01); *H01L 29/408* (2013.01); *H01L 29/66348* (2013.01); *H01L 29/7397* (2013.01); *H02M 7/53871* (2013.01); *H01L 29/1608* (2013.01);
(Continued)

(58) Field of Classification Search
CPC ............. H01L 29/0692; H01L 29/0696; H01L 129/1608; H01L 29/401; H01L 29/404; H01L 29/408; H01L 29/66348; H01L 21/78; H01L 21/304; H01L 23/34; H01L 23/544; H01L 2223/5446; H02M 7/53871; H02P 27/08
See application file for complete search history.

(56) References Cited

U.S. PATENT DOCUMENTS

| 9,048,085 B2 * | 6/2015 | Senoo | ..................... H01L 29/02 |
| 2015/0054118 A1 * | 2/2015 | Senoo | ................... H01L 29/404 |
| | | | 257/490 |

(Continued)

FOREIGN PATENT DOCUMENTS

| JP | 2009-071044 A | 4/2009 |
| JP | 2009-111187 A | 5/2009 |
| JP | 2010-161240 A | 7/2010 |

*Primary Examiner* — Matthew V Nguyen
(74) *Attorney, Agent, or Firm* — Studebaker & Brackett PC

(57) ABSTRACT

A semiconductor device includes a semiconductor chip, a cell surface electrode portion, and a peripheral edge surface structure portion. The semiconductor chip has a cell portion and a peripheral edge portion provided around the cell portion in plan view. The cell surface electrode portion is provided on the cell portion. The peripheral edge surface structure portion is provided on the peripheral edge portion. The peripheral edge portion is made thinner than the cell portion so that a back surface of the peripheral edge portion is more concave than a back surface of the cell portion. When the thickness of the cell portion is represented by tc and the size of the step between the cell portion and the peripheral edge portion on the back surface is represented by dtb, 0%<dtb/tc≤1.5% is satisfied.

13 Claims, 17 Drawing Sheets

(51) Int. Cl.
*H01L 29/40* (2006.01)
*H01L 23/34* (2006.01)
*H01L 23/544* (2006.01)
*H01L 21/78* (2006.01)
*H01L 21/304* (2006.01)
*H02M 7/5387* (2007.01)
*H01L 29/66* (2006.01)
*H02P 27/08* (2006.01)
*H01L 29/16* (2006.01)

(52) U.S. Cl.
CPC ...... *H01L 2223/5446* (2013.01); *H02P 27/08* (2013.01)

(56) References Cited

U.S. PATENT DOCUMENTS

| | | | |
|---|---|---|---|
| 2015/0349051 A1* | 12/2015 | Uchida | H01L 29/0619 257/77 |
| 2016/0020161 A1* | 1/2016 | Suzuki | B23K 1/0016 257/706 |
| 2016/0141376 A1* | 5/2016 | Rothmaler | H01L 29/42372 257/329 |

* cited by examiner

F I G. 1
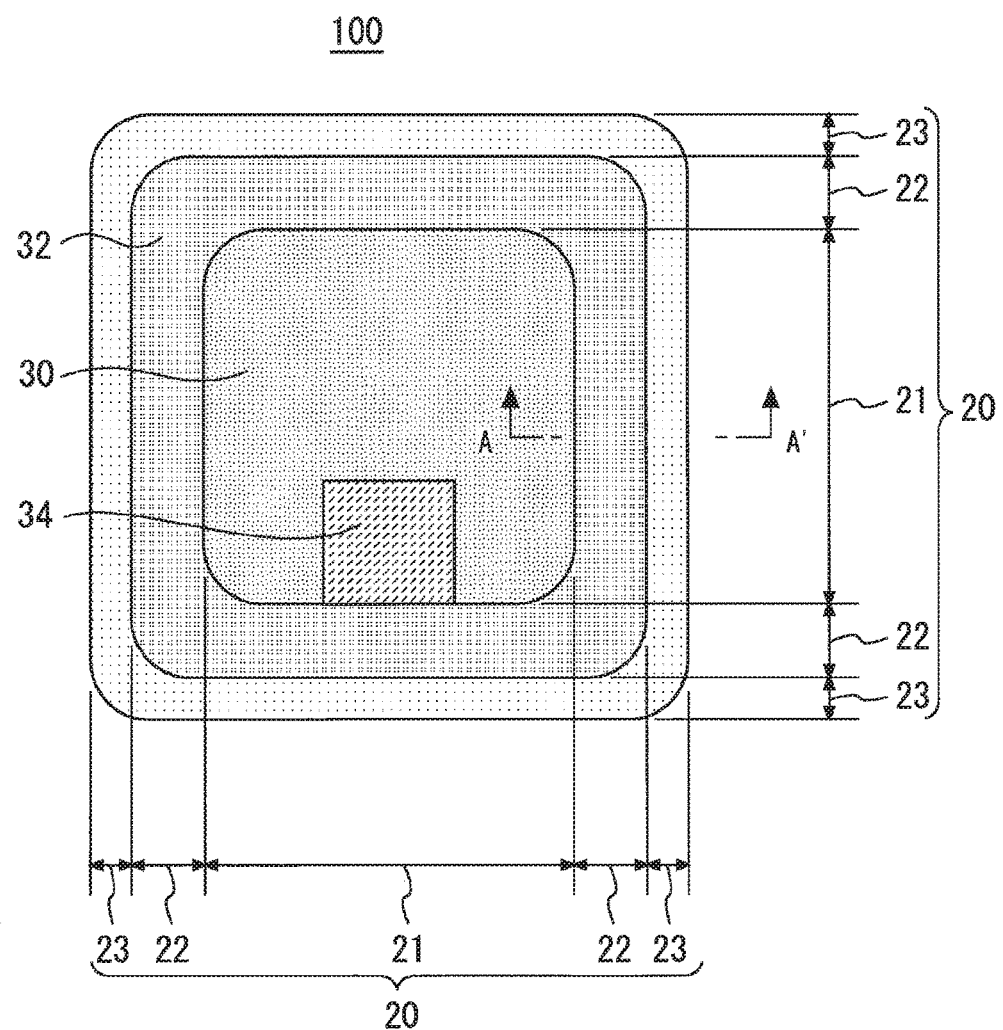

F I G. 3
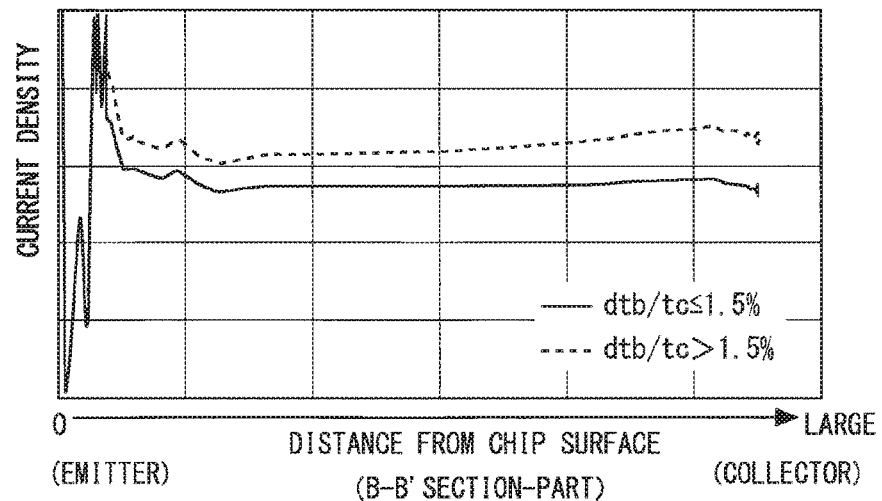
F I G. 4
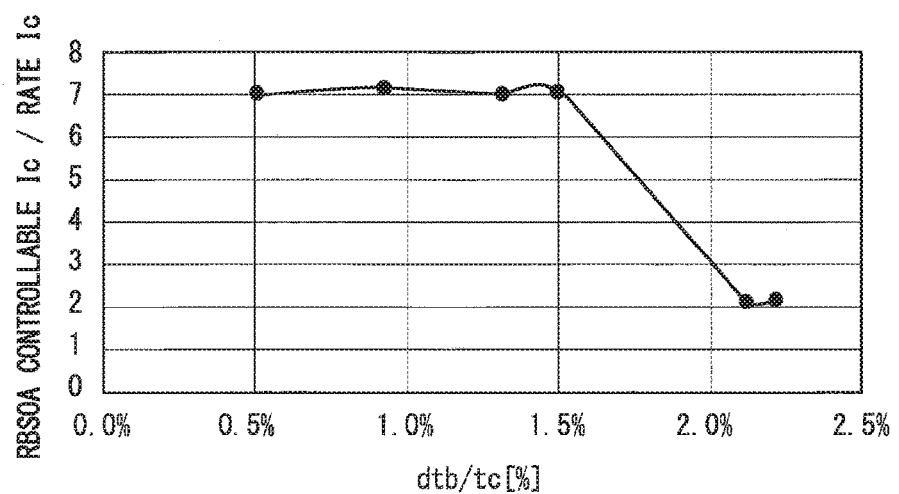

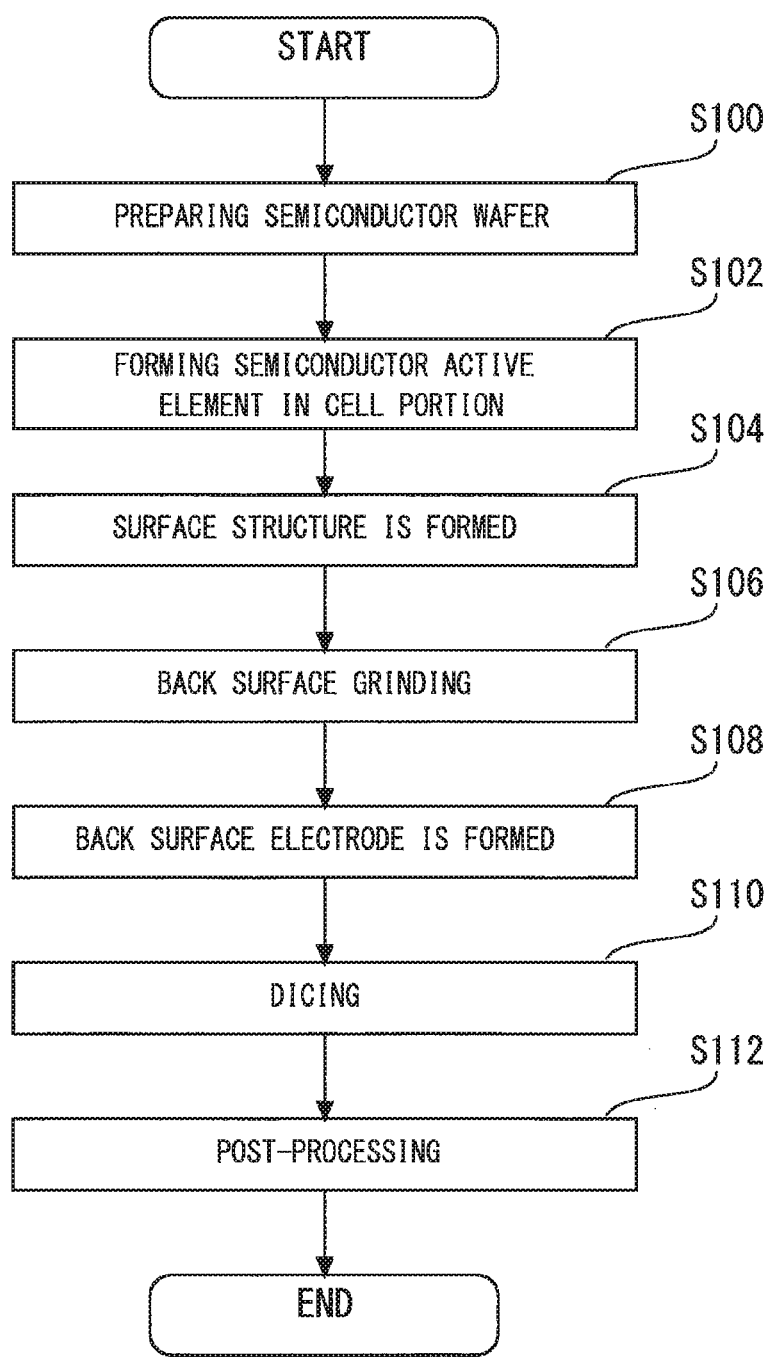
F I G. 1 7

SEMICONDUCTOR DEVICE, METHOD OF MANUFACTURING THE SAME AND POWER CONVERSION DEVICE

FIELD

The present invention relates to a semiconductor device, a method of manufacturing the same and a power conversion device.

BACKGROUND

For example, as disclosed in JP 2009-71044 A, a semiconductor device having a convex portion provided on a surface of a semiconductor layer has been conventionally known. The semiconductor device described in paragraph [0016], FIG. 1, etc. of the above publication includes a semiconductor layer, an emitter electrode formed on the surface of the semiconductor layer, a first convex portion provided along the outer periphery of the surface of the semiconductor device so as to make a round inside the periphery, and a second convex portion formed in an inner range of the first convex portion.

Patent Literature 1: JP 2009-71044 A

SUMMARY

A semiconductor chip constituting the semiconductor device includes a cell portion having a semiconductor active element formed therein, and a peripheral edge portion provided on the periphery of the cell portion. A cell surface electrode portion is provided on the cell portion, and a peripheral edge surface structure portion is provided on the peripheral edge portion. The cell surface electrode portion and the peripheral edge surface structure portion have different heights in some cases. In this case, a step exists on the surface of a semiconductor wafer before formation of a chip.

In order to reduce the thickness of the semiconductor wafer, a step of grinding the back surface of the semiconductor wafer is frequently executed. When the back surface grinding step is executed, a level difference corresponding to the size of a step on the front surface of the semiconductor wafer is formed on the back surface of the wafer. When the peripheral edge surface structure portion is provided to be higher than the cell surface electrode portion, the back surface of the peripheral edge portion is ground more deeply than the back surface of the cell portion by the back surface grinding step. As a result, a back surface of the peripheral edge portion is more concave than a back surface of the cell portion. One characteristic of semiconductor devices for power is a reverse bias safe operation area (RBSOA). When the level difference on the back surface between the peripheral edge portion and the cell portion is too large, it causes a problem that current concentration occurring in the cell portion reduces RBSOA resistance.

The present application has an object to provide a semiconductor device that is improved so as to be capable of suppressing current concentration on a cell portion, a manufacturing method thereof, and a power conversion device.

A semiconductor device according to a first aspect of the present application includes: a semiconductor chip, a cell surface electrode portion, and a peripheral edge surface structure portion. The semiconductor chip has a plane-body shape having a front surface and a back surface. The semiconductor chip includes a cell portion provided in a central region in plan view of the plane-body shape and a peripheral edge portion provided around the cell portion in the plan view of the plane-body shape. The cell surface electrode portion is provided on the front surface of the cell portion. The peripheral edge surface structure portion is provided on the front surface of the peripheral edge portion, and has a top surface higher than a top surface of the cell surface electrode portion. The peripheral edge portion is made thinner than the cell portion so that the back surface of the peripheral edge portion is more concave than the back surface of the cell portion. When a thickness of the cell portion is represented by to and a level difference between the cell portion and the peripheral edge portion on the back surface is represented by dtb, $0\% < dtb/tc \le 1.5\%$ is satisfied.

A power conversion device according to a second aspect of the present application includes: a main conversion circuit that includes a semiconductor device, converts input power by the semiconductor device and outputs the converted input power, a driving circuit for outputting a drive signal for driving the semiconductor device to the semiconductor device; and a control circuit for outputting a control signal for controlling the driving circuit to the driving circuit. The semiconductor device includes a semiconductor chip, a cell surface electrode portion, and a peripheral edge surface structure portion. The semiconductor chip has a plane-body shape having a front surface and a back surface. The semiconductor chip includes a cell portion provided in a central region in plan view of the plane-body shape, and a peripheral edge portion provided around the cell portion in the plan view of the plane-body shape. The cell surface electrode portion is provided on the front surface of the cell portion. The peripheral edge surface structure portion is provided on the front surface of the peripheral edge portion, and has a top surface higher than a top surface of the cell surface electrode portion. The peripheral edge portion is made thinner than the cell portion so that the back surface of the peripheral edge portion is more concave than the beck surface of the cell portion. When a thickness of the cell portion is represented by tc and a level difference between the cell portion and the peripheral edge portion on the back surface is represented by dtb, $0\% < dtb/tc \le 1.5\%$ is satisfied.

A semiconductor device manufacturing method according to a third aspect of the present application includes: a preparing step, an element forming step, a surface structure forming step, a back surface grinding step, and a dicing step. In the preparing step, a semiconductor wafer having a front surface and a back surface is prepared. In the element forming step, a semiconductor active element is formed in a cell portion as a predetermined part in the semiconductor wafer. In the surface structure forming step, a cell surface electrode portion is formed on a front surface of the cell portion after the semiconductor active element is formed, and a peripheral edge surface structure portion is formed in a peripheral edge portion around the cell portion on the front surface of the semiconductor wafer so that the peripheral edge surface structure has a top surface higher than a top surface of the cell surface electrode portion. The cell surface electrode portion and the peripheral edge surface structure portion are formed so that $0\% < dtf/tc \le 1.5\%$ is satisfied when a thickness of the cell portion is represented by tc and a difference in height between the top surface of the cell surface electrode portion and the top surface of the peripheral edge surface structure portion is represented by dtf. In the back surface grinding step, wafer thinning of grinding the back surface of the semiconductor wafer is performed after the cell surface electrode portion and the peripheral edge surface structure portion are formed, whereby a level difference occurring on the front surface due to the cell surface electrode portion and the peripheral edge surface structure portion is transferred onto the back surface of the peripheral edge portion. In the dicing step, dicing of the semiconductor wafer along a dicing line provided on an outer periphery of the peripheral edge portion is conducted after performing the wafer thinning.

Other and further objects, features and advantages of the invention will appear more fully from the following description.

BRIEF DESCRIPTION OF DRAWINGS

FIG. 1 is a plan view showing a structure of a semiconductor device according to a first embodiment;

FIG. 3 is a graph showing the action and effect of the semiconductor device according to the first embodiment;

FIG. 4 is a graph showing the action and effect of the semiconductor device according to the first embodiment;

FIG. 17 is a flowchart showing a method of manufacturing a semiconductor device according to a seventh embodiment;

DESCRIPTION OF EMBODIMENTS

Figure 2:
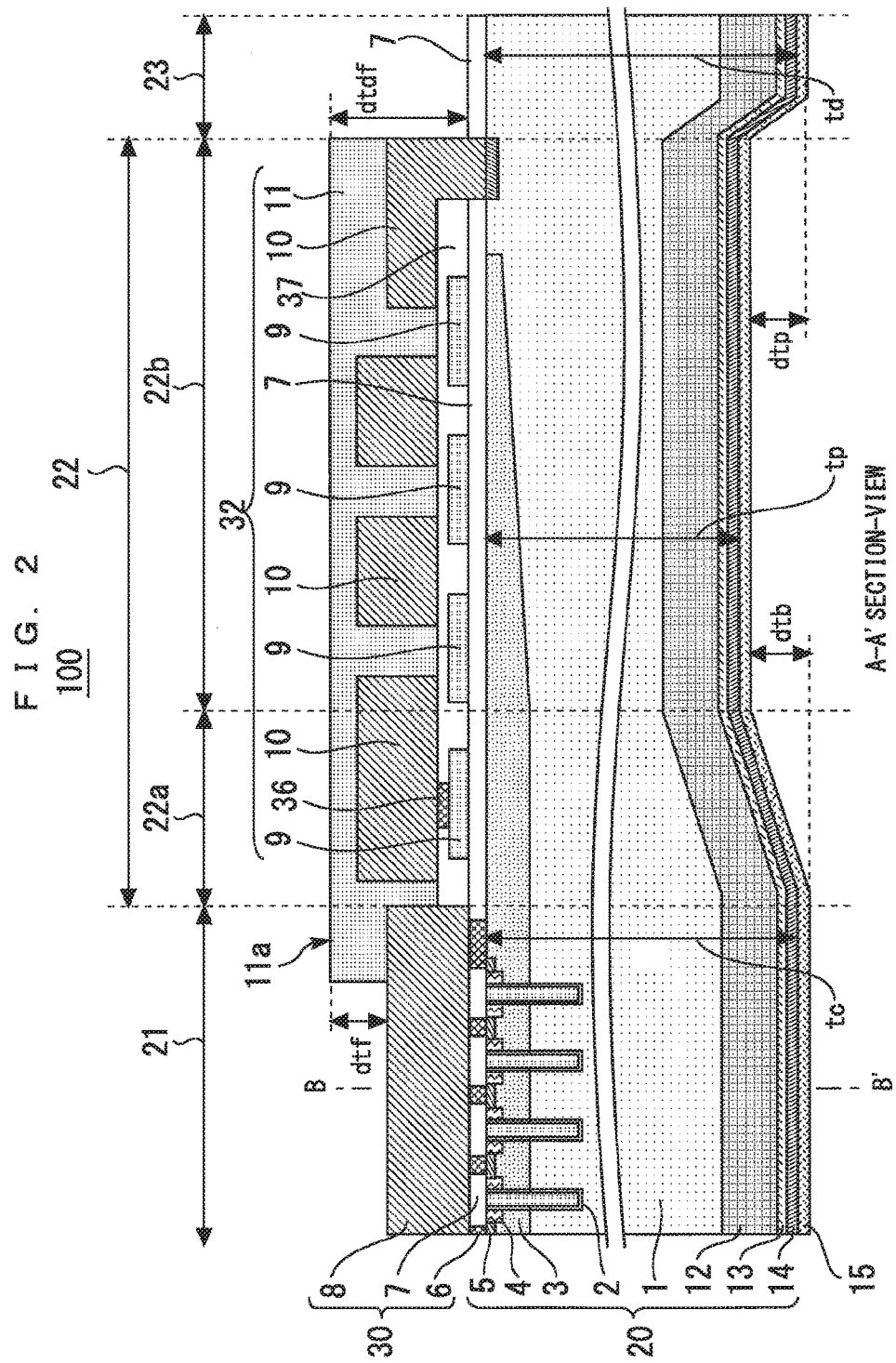
FIG. 2 is a cross-sectional view showing the structure of the semiconductor device according to the first embodiment.

FIG. 1 is a plan view showing a structure of a semiconductor device 100 according to a first embodiment. The semiconductor device 100 includes a semiconductor chip 20, a cell surface electrode portion 30, a peripheral edge surface structure portion 32, and a gate pad 34. The semiconductor chip 20 has a plane-body shape having a front surface and a back surface.

The semiconductor chip 20 includes a cell portion 21, a peripheral edge portion 22, and a dicing line portion 23. The cell portion 21 is a part of a central region of the semiconductor chip 20 in plan view. The cell portion 21 is provided with a semiconductor active element. In the first embodiment, specifically, the cell portion 21 is provided with a transistor element, and more specifically, this transistor element is an insulated gate bipolar transistor (IGBT). The peripheral edge portion 22 is a square annular part provided around the cell portion 21 in plan view of the semiconductor chip 20. The dicing line portion 23 is a square annular part provided on the outer periphery of the peripheral edge portion 22 in plan view of the semiconductor chip 20.

The cell surface electrode portion 30 is provided on the cell portion 21. The peripheral edge surface structure portion 32 is provided on the peripheral edge portion 22. As shown in the cross-sectional view of FIG. 2, the top surface of the peripheral edge surface structure portion 32 is higher than the top surface of the cell surface electrode portion 30.

FIG. 2 is a cross-sectional view showing the structure of the semiconductor device 100 according to the first embodiment. FIG. 2 shows a cross-section of the semiconductor device 100 taken along line A-A' in FIG. 1. In FIG. 2, the cell portion 21, the peripheral edge portion 22 and the dicing line portion 23 in the semiconductor chip 20 are demarcated from one another by broken lines. The peripheral edge portion 22 is further demarcated into a gate wiring portion 22a provided adjacently to the cell portion 21 and a peripheral edge concave portion 22b provided outside the gate wiring portion 22a.

The semiconductor chip 20 has an n-type semiconductor substrate 1. In the first embodiment, it is assumed that the material of the semiconductor substrate 1 is silicon. As a modification, the material of the semiconductor substrate 1 may be a wide bandgap semiconductor having a larger bandgap than silicon. SiC, GaN or diamond may be used as the wide bandgap semiconductor.

In the semiconductor device 100 according to the first embodiment, the cell portion 21 is provided with an insulated gate bipolar transistor (IGBT). However, instead of the IGBT, another transistor element such as a field effect transistor (MOSFET) may be provided to the cell portion 21. For example, when the semiconductor substrate 1 is modified from silicon to SiC, the transistor element formed in the cell portion 21 may be MOSFET. In addition, the cell portion 21 may be provided with another semiconductor active element such as a diode element instead of the transistor element. The modifications applied to the material of the semiconductor substrate 1 and the semiconductor active element described here can be likewise applied to all the embodiments described later.

In the semiconductor chip 20, semiconductor active elements are formed on the front surface and the back surface of the semiconductor substrate 1 by element formation processes such as impurity implantation and etching. A p-type base layer 3 is provided over the cell portion 21 and the peripheral edge portion 22 on a front-surface side of the semiconductor chip 20. On the front-surface side of the semiconductor chip 20, the cell portion 21 is provided with plural trench gates 2 penetrating through the base layer 3 and reaching the semiconductor substrate 1, plural emitter layers 4 of $n^+$-type each provided on both sides of each of the trench gates 2, and plural diffusion layers 5 of $p^+$-type provided between the plural emitter layers 4.

On a back-surface side of the semiconductor chip 20, an n-type first buffer layer 12, an n-type second buffer layer 13, and a collector layer 14 are provided over the whole area of the cell portion 21, the peripheral edge portion 22 and the dicing line portion 23. The collector layer 14, the second buffer layer 13, and the first buffer layer 12 are stacked in turn from the backmost side of the semiconductor chip 20. The first buffer layer 12 is formed by performing impurity implantation or irradiation on a deep portion of the back surface of the semiconductor substrate 1. The second buffer layer 13 is formed by performing impurity implantation only on a shallow portion of the back surface of the semiconductor substrate 1.

The cell surface electrode portion 30 is provided on the cell portion 21 of the semiconductor chip 20. The cell surface electrode portion 30 includes an interlayer insulating film 7 stacked on the front surface of the semiconductor chip 20, plural contact portions 6 formed of conductors penetrating through the interlayer insulating film 7, and a first emitter electrode 8 which is provided on the interlayer insulating film 7 and connected to the contact portions 6. The first emitter electrode 8 is formed of a material having a low resistance such as a metal.

On the back surface of the semiconductor chip 20, a collector electrode 15 is provided over the whole area of the cell portion 21, the peripheral edge portion 22, and the dicing line portion 23. These structures provided on the front surface and the back surface form IGBT in the cell portion 21.

The peripheral edge surface structure portion 32 is provided on the peripheral edge portion 22 of the semiconductor chip 20. The peripheral edge surface structure portion 32 includes the interlayer insulating film 7, plural first field plate electrodes 9, an upper layer insulating film 37, plural second field plate electrodes 10, and a protective insulating film 11. The interlayer insulating film 7 is stacked on the surface of the peripheral edge portion 22 of the semiconductor chip 20. The plural first field plate electrodes 9 are provided on the interlayer insulating film 7 while being spaced apart from one another. The first field plate electrodes 9 may be formed of an n-type polysilicon film. The upper layer insulating film 37 covers the plural first field plate electrodes 9. The plural second field plate electrodes 10 are provided on the upper layer insulating film 37 while being spaced apart from one another. Like the first emitter electrode 8, the second field plate electrodes 10 may be formed of a material having a low resistance such as a metal.

The protective insulating film 11 covers the plural second field plate electrodes 10. The protective insulating film 11 is an uppermost layer of the peripheral edge surface structure portion 32, and covers the first field plate electrodes 9, the upper layer insulating film 37 and the second field plate electrodes 10. The protective insulating film 11 is a structure provided for the purpose of securing a withstand voltage and reliability, and is formed only in the peripheral edge portion 22 in the first embodiment. An end portion 11a of the protective insulating film 11 covers parts of an end face and an upper face of the first emitter electrode 8.

A contact portion 36 penetrating through the upper layer insulating film 37 is formed in the gate wiring portion 22a out of the peripheral edge portion 22. The contact portion 36 connects the first field plate electrode 9 and the second field plate electrode 10.

When the semiconductor device 100 according to the first embodiment is viewed as a simple product substance, no other structure is provided on the first emitter electrode 8, and the first emitter electrode 8 is kept in an exposed state. When the semiconductor device 100 is mounted in a case or the like to construct a power conversion device or the like, wires and solder are formed on the first emitter electrode 8.

The height of the top surface of the cell surface electrode portion 30 and the height of the top surface of the peripheral edge surface structure portion 32 in the semiconductor device 100 are respectively defined. "The height of the top surface of the cell surface electrode portion 30" is defined as the height from the surface of the semiconductor chip 20 in the cell portion 21 to the upper surface of the first emitter electrode 8. "The height of the top surface of the cell surface electrode portion 30" is equal to the sum of the thickness of the interlayer insulating film 7 and the thickness of the first emitter electrode 8.

"The height of the top surface of the peripheral edge surface structure portion 32" is defined as the height from the surface of the semiconductor chip 20 in the peripheral edge portion 22 to the upper surface of the protective insulating film 11. "The height of the top surface of the peripheral edge surface structure portion 32" is equal to the sum of the thickness of the interlayer insulating film 7, the thickness of the upper layer insulating film 37 covering the first field plate electrodes 9, and the thickness of the protective insulating film 11 covering the second field plate electrodes 10. The top surface of the peripheral edge surface structure portion 32 is higher than the top surface of the cell surface electrode portion 30, and a level difference caused by the difference in height between these top surfaces is referred to as "front-surface level difference dtf".

The interlayer insulating film 7 is provided on the surface of the semiconductor chip 20 in the dicing line portion 23. The top surface of the dicing line portion 23 is lower than the top surface of the peripheral edge surface structure portion 32, and a level difference caused by the difference in height between these top surfaces is referred to as "end portion front-surface level difference dtdf".

As shown in FIG. 2, a step is provided on the back surface side of the semiconductor device 100. That is, the semiconductor chip 20 has a structure in which the peripheral edge portion 22 is made thinner than the cell portion 21 so that the back surface of the peripheral edge portion 22 is more concave than the back surface of the cell portion 21. The back surface of the cell portion 21 is shaped to be flat in parallel to the front surface of the cell portion 21. The peripheral edge portion 22 has different back surface structures in the gate wiring portion 22a and the peripheral edge concave portion 22b. The back surface of the gate wiring portion 22a has a tapered shape so as to be inclined with respect to the surface of the gate wiring portion 22a. The back surface of the peripheral edge concave portion 22b is shaped to be flat in parallel to the front surface of the peripheral edge concave portion 22b.

As shown in FIG. 2, the thickness of the cell portion 21 is represented by tc. More specifically, the thickness tc is the thickness of the cell portion 21 at the boundary between the cell portion 21 and the peripheral edge portion 22. As shown in FIG. 2, the minimum thickness of the peripheral edge portion 22 is represented by tp. More specifically, the minimum thickness tp is the thickness of the peripheral edge concave portion 22b which is the thinnest portion of the peripheral edge portion 22. The size of the step between the cell portion 21 and the peripheral edge portion 22 on the back surface is referred to as a first back-surface level difference dtb. The first back-surface level difference dtb is equal to the difference between the thickness tc and the minimum thickness tp.

In the first embodiment, the peripheral edge portion 22 is made thinner than the cell portion 21 within a range satisfying the following expression (1). In the following expression (1), it is assumed that dtb≠0 and tc≠0.

$$0\% < dtb/tc \leq 1.5\% \quad (1)$$

A level difference corresponding to the dimension of the step between the cell surface electrode portion 30 and the peripheral edge surface structure portion 32 is transferred onto the back surface of the semiconductor wafer by the grinding step of the back surface of the semiconductor wafer to reduce the wafer thickness. Details of this grinding step will be described with reference to a manufacturing method according to a seventh embodiment to be described later. It is general that the transfer of the level difference described above makes the front-surface level difference dtf and the first back-surface level difference dtb equal to each other.

In order to obtain the first back-surface level difference dtb satisfying the foregoing expression (1) after the grinding step of the back surface of the semiconductor wafer, it is preferable that the front-surface level difference dtf satisfies the following expression (2) in the first embodiment. In the following expression (2), it is assumed that dtf≠0 and tc≠0.

$$0\% < dtf/tc \leq 1.5\% \qquad (2)$$

As shown in FIG. 2, in the first embodiment, the dicing line portion 23 is made thicker than the peripheral edge portion 22 so that the back surface of the dicing line portion 23 protrudes as compared with the back surface of the peripheral edge portion 22. As shown in FIG. 2, the thickness of the dicing line portion 23 is represented by td. The size of the step between the dicing line portion 23 and the peripheral edge portion 22 on the back surface of the semiconductor chip 20 is referred to as "second back-surface level difference dtp". The second back-surface level difference dtp is equal to the difference between the thickness td and the minimum thickness tp.

In the first embodiment, the dicing line portion 23 is made thicker than the peripheral edge portion 22 within a range satisfying the following expression (3). In the following expression (3), it is assumed that dtp≠0 and td≠0.

$$1.5\% \leq dtp/td \qquad (3)$$

FIGS. 3 and 4 are graphs showing the action and effect of the semiconductor device 100 according to the first embodiment. FIG. 3 shows the difference in RBSOA test results according to the value of dtb/tc which is the ratio between the first back-surface level difference dtb and the thickness tc of the cell portion 21. RBSOA represents an abbreviation of Reverse Bias Safe Operation Area.

The graph of FIG. 3 shows a simulation result of a current density distribution at a B-B' cross-sectional portion of FIG. 2 under the RBSOA test. A circuit used for the test is a switching circuit for a general RBSOA test. The test condition is that the junction portion temperature Tj=448 K, the collector-emitter voltage Vce=800 V, the gate-emitter voltage Vge=20 V/−15 V, the collector current Ic=1150 A, and the parasitic inductance L=70 nH. FIG. 3 shows a solid-line graph in which dtb/tc is equal to 1.5% or less and a broken-line graph in which dtb/tc is larger than 1.5%. In the broken-line graph in which dtb/tc is larger than 1.5%, current concentrates on the cell portion 21, so that the RBSOA resistance has deteriorated.

FIG. 4 shows the dtb-dependence of a breakable current of RBSOA. When the value of dtb/tc is larger than 1.5%, the breakable current decreases according to the increase of dtb/tc. For example, when the first back-surface level difference dtb is so large that the value of dtb/tc reaches 2.0%, the breakable current decreases to about one third. Such decrease of RBSOA resistance is not preferable When the thickness tc of the semiconductor wafer is sufficiently large, the influence of the first back-surface level difference dtb is insignificant. However, as the thickness tc decreases due to thinning of the semiconductor wafer, the rate of the first back-surface level difference dtb to the thickness tc increases. Therefore, in recent technical trends in which thinning of semiconductor wafers has been pursued, there is a problem that the problem of decrease of RBSOA resistance due to the first back-surface level difference dtb becomes obvious.

In this regard, according to the first embodiment, the first back-surface level difference dtb is adjusted within the range of the above-described expression (2). Since the first back-surface level difference dtb can be kept within a certain range so that the peripheral edge portion 22 is not excessively thin as compared with the cell portion 21, the value of dtb/tc is suppressed to 1.5% or less. As a result, as shown in FIG. 4, the first back-surface level difference dtb can be managed within a range that does not cause decrease of the RBSOA breakable current. In particular, according to data shown in FIG. 4, by setting the value of dtb/tc to 1.5% or less, RBSOA controllable Ic can be secured to be seven times or more as large as rated Ic.

Figure 5:
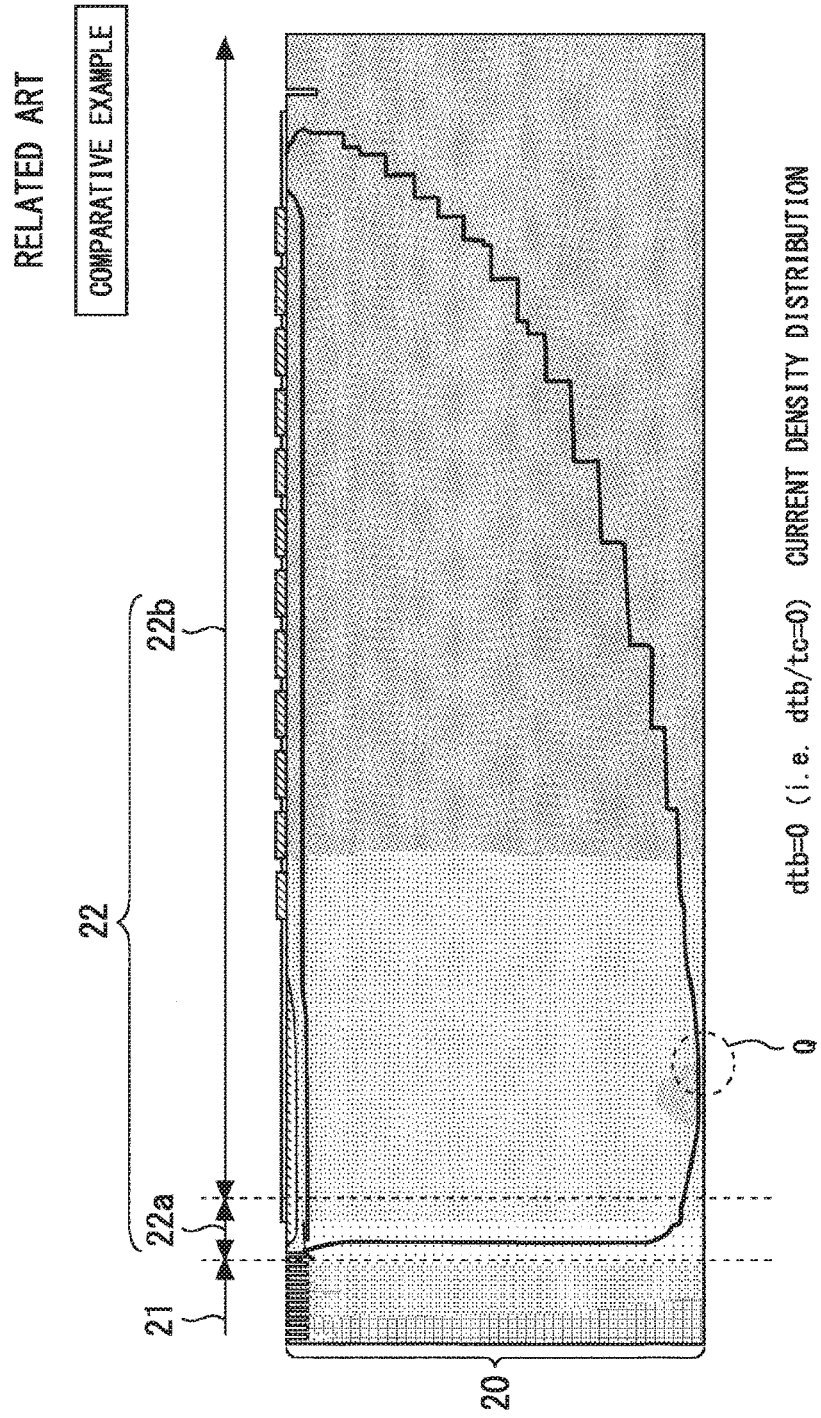
FIG. 5 is a diagram showing the action and effect of the semiconductor device of the first embodiment by using a comparative example to the embodiment.
Figure 6:
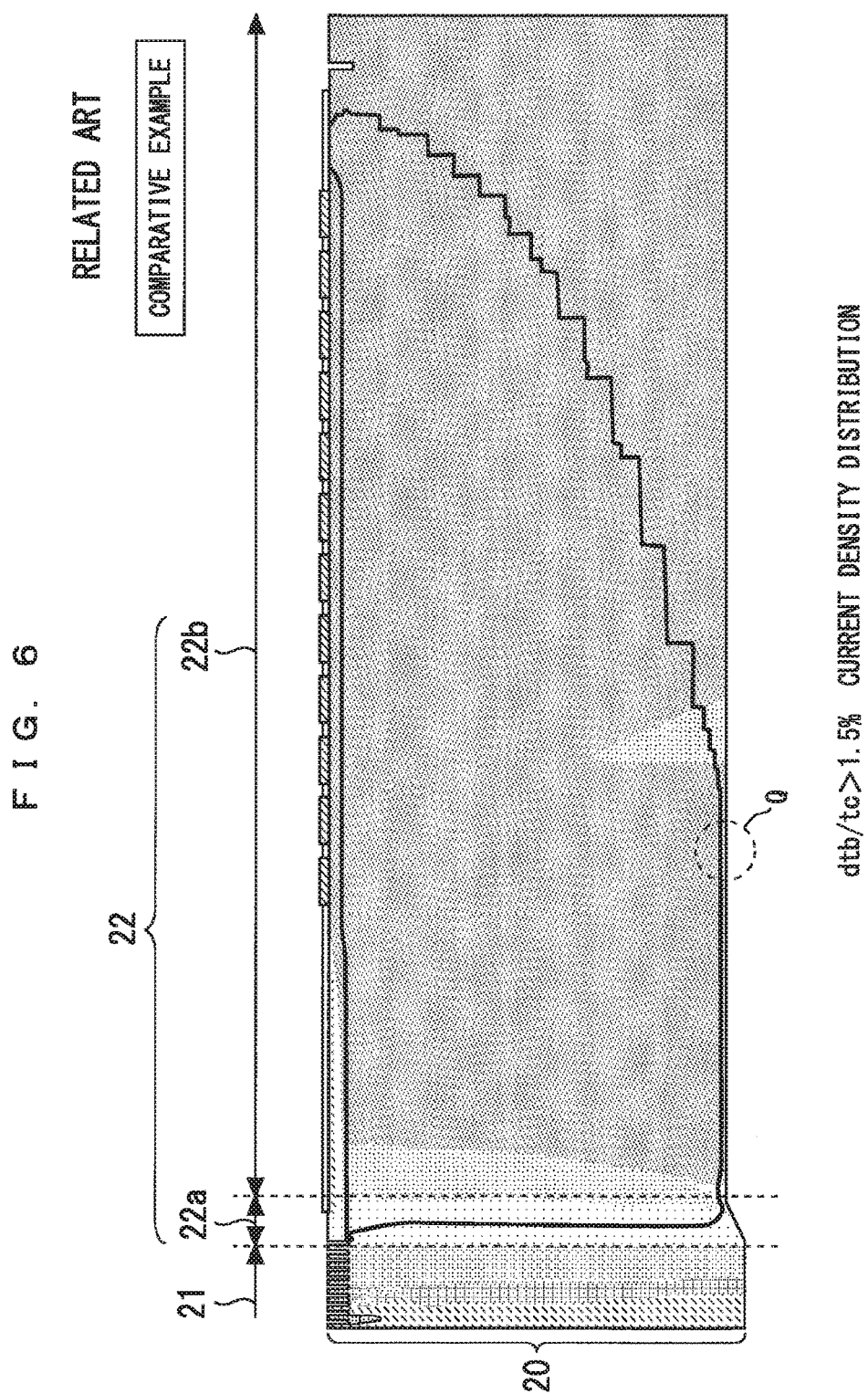
FIG. 6 is a diagram showing the action and effect of the semiconductor device of the first embodiment by using a comparative example to the embodiment.

FIGS. 5 and 6 are diagrams showing the action and effect of the semiconductor device 100 of the first embodiment by using a comparative example to the embodiment. As the first back-surface level difference dtb becomes larger, the minimum thickness tp of the peripheral edge portion 22 becomes smaller. FIG. 5 is a graph represented as a comparative example, and shows a current density distribution of the semiconductor device 100 when it is assumed that dtb=0, that is, there is no back-surface level difference. FIG. 6 is a graph represented as a comparative example, and shows a current density distribution of the semiconductor device 100 when it is assumed that dtb/tc>1.5%. Since there is a difference in the presence or absence of the back-surface level difference, the minimum thickness tp of the peripheral edge portion 22 in FIG. 6 is thinner than that in FIG. 5.

When comparing FIGS. 5 and 6 with each other, a depletion layer end Q is prone to reach the back surface of the semiconductor chip 20 in a result of FIG. 6 where the minimum thickness tp of the peripheral edge portion 22 is smaller. When the depletion layer end Q tends to reach the back surface of the semiconductor chip 20, holes accumulated in the peripheral edge portion 22 are prone to flow into the cell portion 21. The flow of the accumulated holes of the peripheral edge portion 22 into the cell portion 21 causes current concentration on the cell portion 21.

Figure 7:
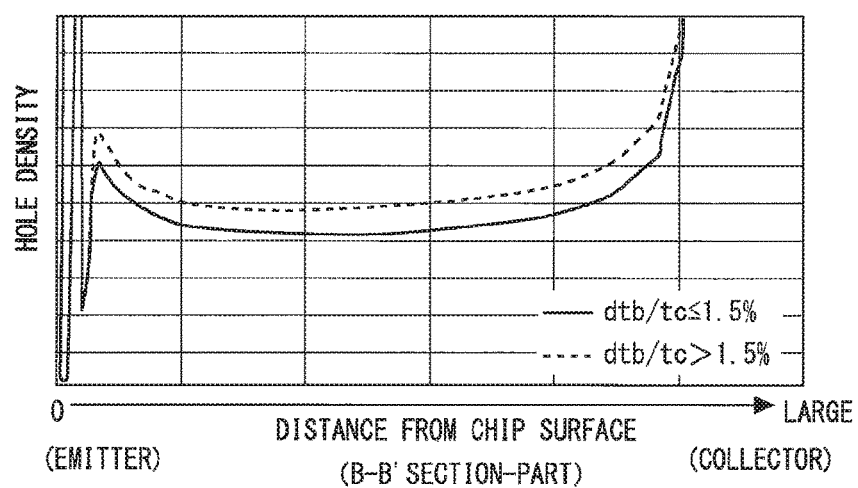
FIG. 7 is a graph showing the action and effect of the semiconductor device according to the first embodiment.

FIG. 7 is a graph showing the action and effect of the semiconductor device 100 according to the first embodiment. The graph of FIG. 7 shows a simulation result of a hole density distribution at the B-B' cross-sectional portion of FIG. 2. A solid-line graph of dtb/tc≤1.5% and a broken-line graph of dtb/tc>1.5% are shown in FIG. 7. The hole density of the cell portion 21 increases more greatly in the broken-line graph than that in the solid-line graph. The result shown in FIG. 7 indicates that when the first back-surface level difference dtb is large, current concentration on the cell portion 21 occurs, as understood from the comparison result between FIGS. 5 and 6 described above.

In this regard, according to the first embodiment, the relationship in thickness between the cell portion 21 and the peripheral edge portion 22 can be kept within a certain range so that the peripheral edge portion 22 is not excessively thinned as compared with the cell portion 21. When the peripheral edge portion 22 is suppressed from being excessively thinned as compared with the cell portion 21, the distance between the depletion layer end Q in the peripheral edge portion 22 and the back surface of the peripheral edge portion 22 can be suppressed from being excessively short.

Since the distance between the depletion layer end Q in the peripheral edge portion 22 and the back surface of the peripheral edge portion 22 can be secured to be large to some extent, the holes accumulated in the peripheral edge portion 22 can be prevented from flowing into the cell portion 21. By suppressing the holes accumulated in the peripheral edge portion 22 from flowing into the cell portion 21, it is possible to suppress occurrence of increase in hole density in the cell portion 21. Suppression of the increase in hole density in the cell portion 21 makes it possible to suppress current concentration on the cell portion 21. By suppressing the current concentration on the cell portion 21, it is possible to suppress decrease in RBSOA resistance.

In the first embodiment, since the protective insulating film 11 covers the edge portion of the first emitter electrode 8, that is, the edge portion of the cell surface electrode portion 30, the following effect is obtained. When the end portion of the first emitter electrode 8 and the end portion of the protective insulating film 11 are flush with each other, there is a risk that a gap may be formed between the first emitter electrode 8 and the protective insulating film 11 due to manufacturing variations. When the surface of the semiconductor chip 20 is exposed by this gap, moisture may infiltrate from the exposed part of the gap. In this respect, according to the first embodiment, the occurrence of the gap as described above can be prevented by covering the side end face and the upper-surface edge portion of the first emitter electrode 8 with the protective insulating film 11. Therefore, the infiltration of moisture can be suppressed, and the reliability of the semiconductor device 100 can be enhanced.

Further, according to the first embodiment, the following effect can be obtained by satisfying the condition of the above-described expression (3) with reference to the dicing line portion 23. In order to reduce wearing of a dicing blade, it is preferable that no film is provided on the dicing line portion 23 or the film thickness is reduced to be as small as possible even when a film is provided on the dicing line portion 23. When the end portion front-surface level difference dtdf is large, the end portion front-surface level difference dtdf is transferred onto the back surface of the wafer by grinding of the back surface of the wafer. As a result of the transfer, the second back-surface level difference dtp has a certain degree of magnitude. However, the dicing line portion 23 does not serve as a current path during the RBSOA operation. Accordingly, even when a large level difference is transferred onto the back surface so that dtp/td is equal to 1.5% or more, the RBSOA resistance does not deteriorate. According to the first embodiment, the wearing of the dicing blade can be reduced without reducing the RBSOA resistance by making dtp/td to be 1.5% or more.

Figure 8:
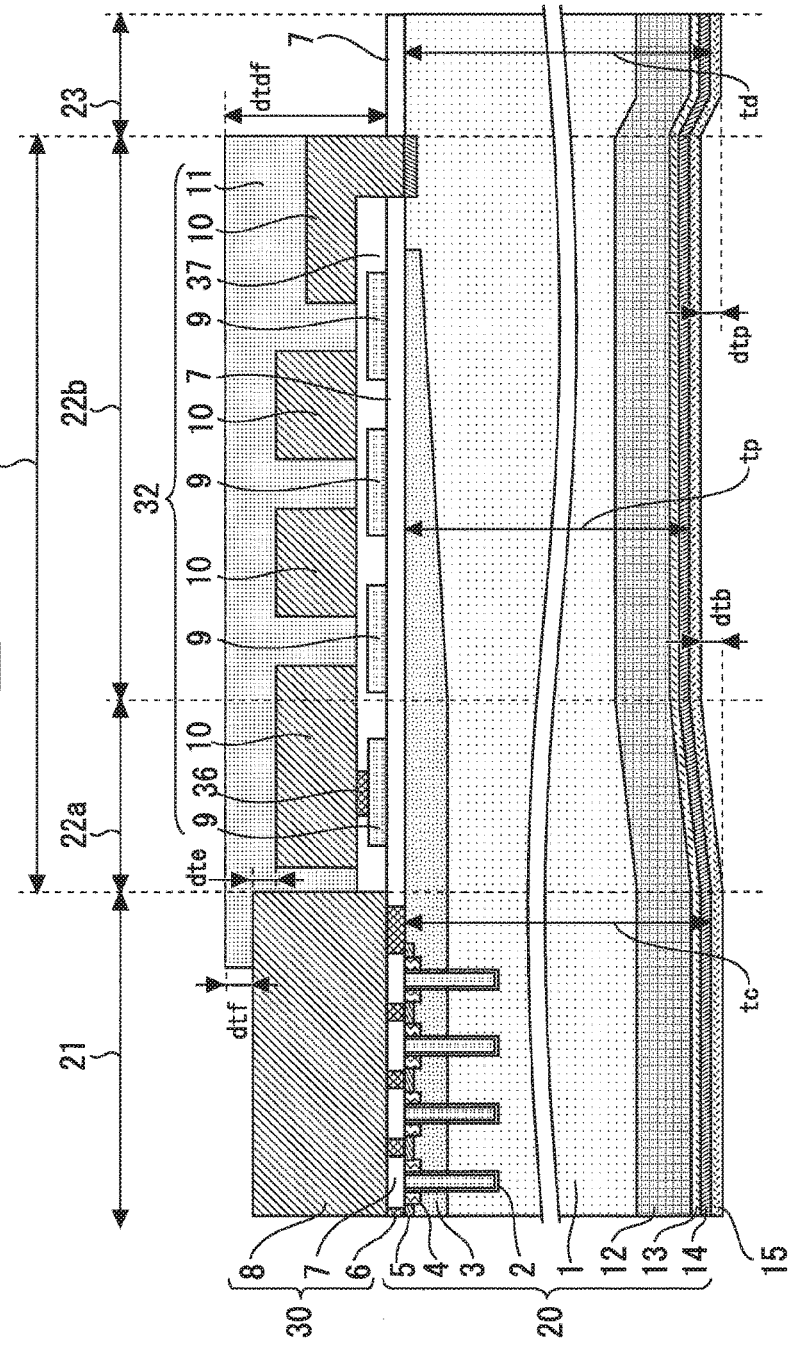
FIG. 8 is a cross-sectional view showing a structure of a semiconductor device according to a modification of the first embodiment.

FIG. 8 is a cross-sectional view showing a structure of a semiconductor device 110 according to a modification of the first embodiment. In the semiconductor device 110 according to the modification, the upper surface of the first emitter electrode 8 is set to be higher than the upper surfaces of the second field plate electrodes 10. The difference in height between these upper surfaces is referred to as "dimension dte" of FIG. 8".

According to the structure shown in FIG. 8, since the upper surfaces of the second field plate electrodes 10 are lower than the upper surface of the first emitter electrode 8, the protective insulating film 11 can sufficiently cover the second field plate electrodes 10 even when the protective insulating film 11 is made thin to the extent that the protective insulating film 11 slightly covers the upper surface of the first emitter electrode 8. Since the protective insulating film 11 can be adjusted to have any arbitrary thickness without losing the coating performance of the second field plate electrodes 10, it is easy to adjust the front-surface level difference dtf between the upper surface of the first emitter electrode 8 and the upper surface of the protective insulating film 11. When it becomes easier to adjust the front-surface level difference dtf, it also becomes easier to adjust the first back-surface level difference dtb to be transferred to the back surface. As a result, there is an advantage that the adjustment of dtb/tc to satisfy the above expression (1) becomes easy.

The first back-surface level difference dtb restricted by the foregoing expression (1) and the second back-surface level difference dtp restricted by the foregoing expression (3) may be set independently of each other. In the first embodiment, since dtdf is suppressed for suppression of wearing of the dicing blade, the relationship of dtf<dtdf is satisfied. Therefore, it is estimated that dtb<dtp is satisfied. However, the magnitude relationship between dtb and dtp is not limited. Both of dtb and dtp may be different in magnitude while any one of dtb and dtp is larger than the other, or both of them may be identical to each other in magnitude.

Second Embodiment

Figure 9:
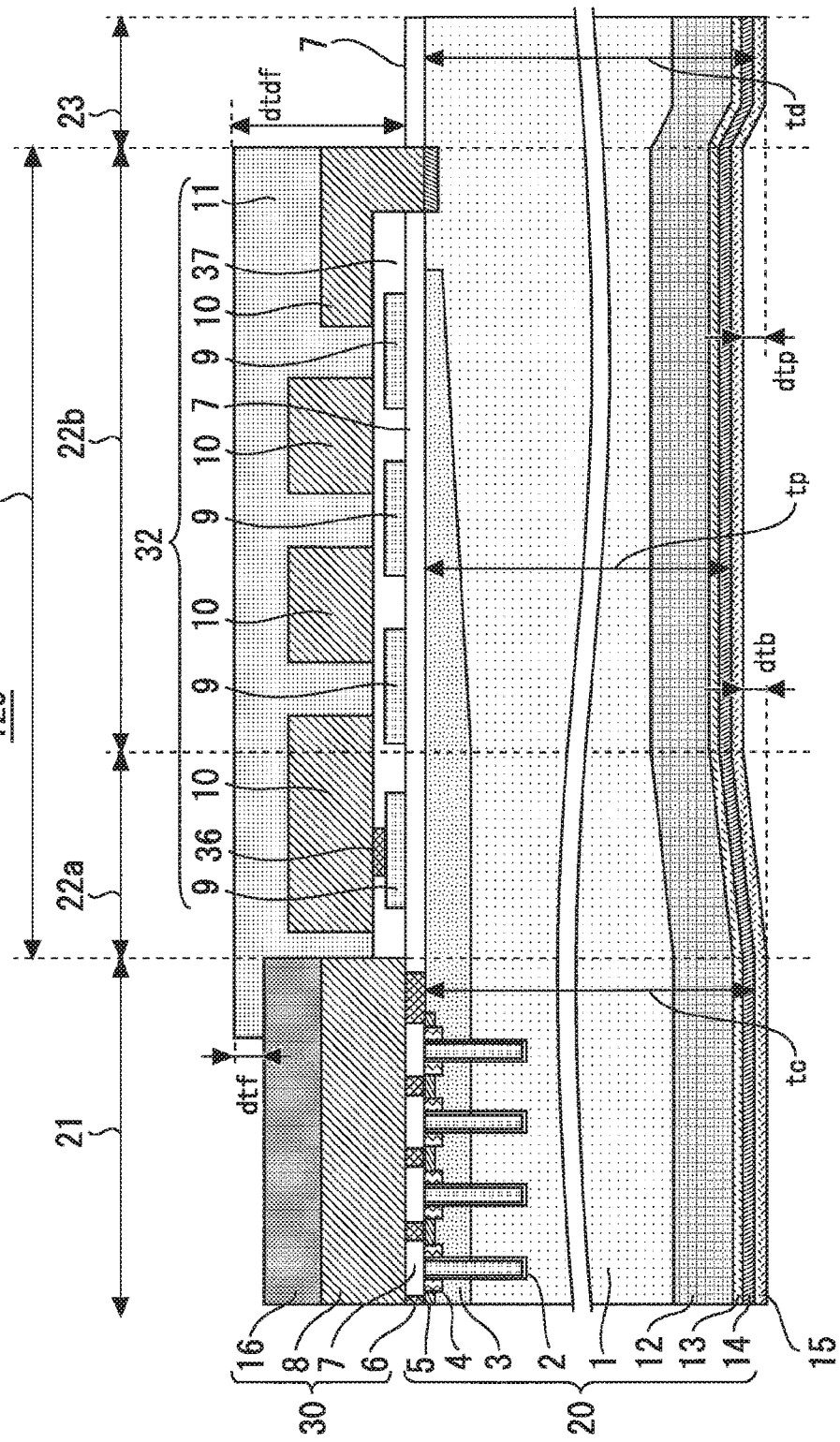
FIG. 9 is a cross-sectional view showing a structure of a semiconductor device according to a second embodiment.

FIG. 9 is a cross-sectional view showing a structure of a semiconductor device 120 according to a second embodiment. The semiconductor device 120 is different from the semiconductor device 100 according to the first embodiment in that a second emitter electrode 16 is provided in addition to the first emitter electrode 8. Other configurations are the same as those in the first embodiment. The second emitter electrode 16 is stacked on the first emitter electrode 8, and is formed of a material having a lower thermal resistance than that of the first emitter electrode 8. The material of the second emitter electrode 16 may be Cu or the like.

In the second embodiment, the upper surface of the second emitter electrode 16 serves as the top surface of the cell surface electrode portion 30. In the second embodiment, a front-surface level difference dtf is provided so as to satisfy the condition of the expression (2) described with reference to the first embodiment. By providing the second emitter electrode 16 having a low thermal resistance, the heat dissipation is enhanced, so that SCSOA resistance can be enhanced. SCSOA is an abbreviation for "Short Circuit Safe Operation Area".

The second embodiment may be modified so that the upper surfaces of the second field plate electrodes 10 may be higher than the upper surface of the second emitter electrode 16. In addition, the various modifications described with reference to the first embodiment may be applied to the second embodiment.

Third Embodiment

Figure 10:
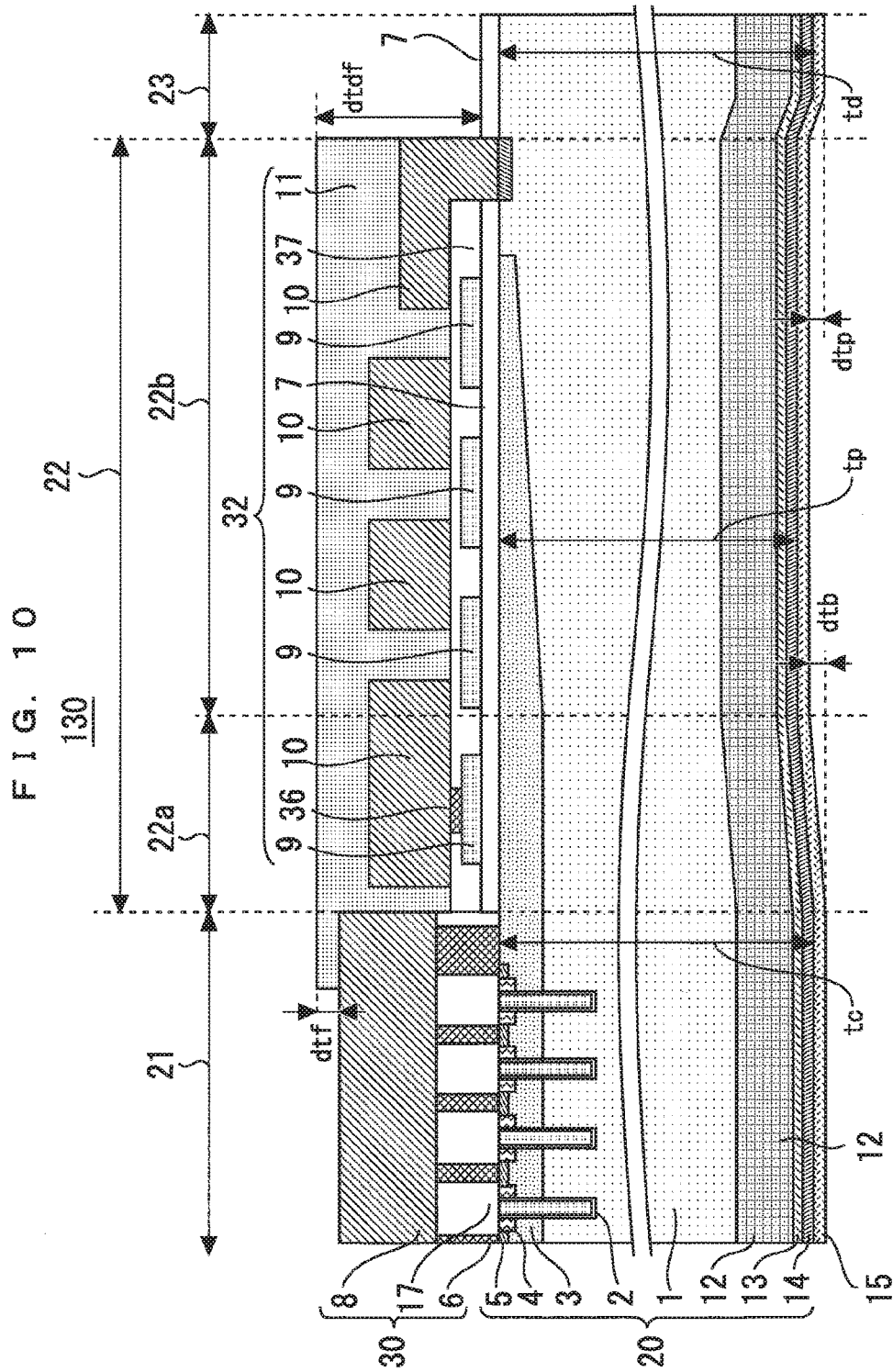
FIG. 10 is a cross-sectional view showing a structure of a semiconductor device according to a third embodiment.

FIG. 10 is a cross-sectional view showing a structure of a semiconductor device 130 according to a third embodiment. The semiconductor device 130 is different from the semiconductor device 100 according to the first embodiment in that the interlayer insulating film 7 in the cell portion 21 is replaced by an interlayer insulating film 17. Other configurations are the same as those in the first embodiment. The cell surface electrode portion 30 includes the interlayer insulating film 17, and the contact portion 6 is provided to the interlayer insulating film 17. The peripheral edge surface structure portion 32 includes the interlayer insulating film 7 and the upper layer insulating film 37 as in the case of the first embodiment, and is provided with the contact portion 36 penetrating through the upper layer insulating film 37.

For convenience of description, in the semiconductor device 130, the contact portion 6 is also referred to as "cell contact portion 6", the contact portion 36 is also referred to as "peripheral edge contact portion 36", the interlayer insulating film 17 is also referred to as "cell portion interlayer insulating film 17", and the upper layer insulating film 37 of the peripheral edge portion 22 is also referred to as "peripheral edge portion insulating film 37". In the third embodiment, the cell portion interlayer insulating film 17 is made thicker than the peripheral edge portion insulating film 37. A parasitic capacitance is generated by the first emitter electrode 8, the semiconductor substrate 1 and the interlayer insulating film sandwiched between the first emitter electrode 8 and the semiconductor substrate 1. The parasitic capacitance can be reduced by replacing the interlayer insulating film 7 of the cell portion 21 according to the first embodiment with the cell portion interlayer insulating film 17 having a large thickness according to the third embodiment.

The third embodiment may be modified so that the upper surfaces of the second field plate electrodes 10 are higher than the upper surface of the first emitter electrode 8. In addition, the various modifications described with reference to the first embodiment may be applied to the third embodiment. Furthermore, the third embodiment may be modified so that the cell surface electrode portion 30 includes the first emitter electrode 8 and the second emitter electrode 16 as in the case of the second embodiment.

Fourth Embodiment

Figure 11:
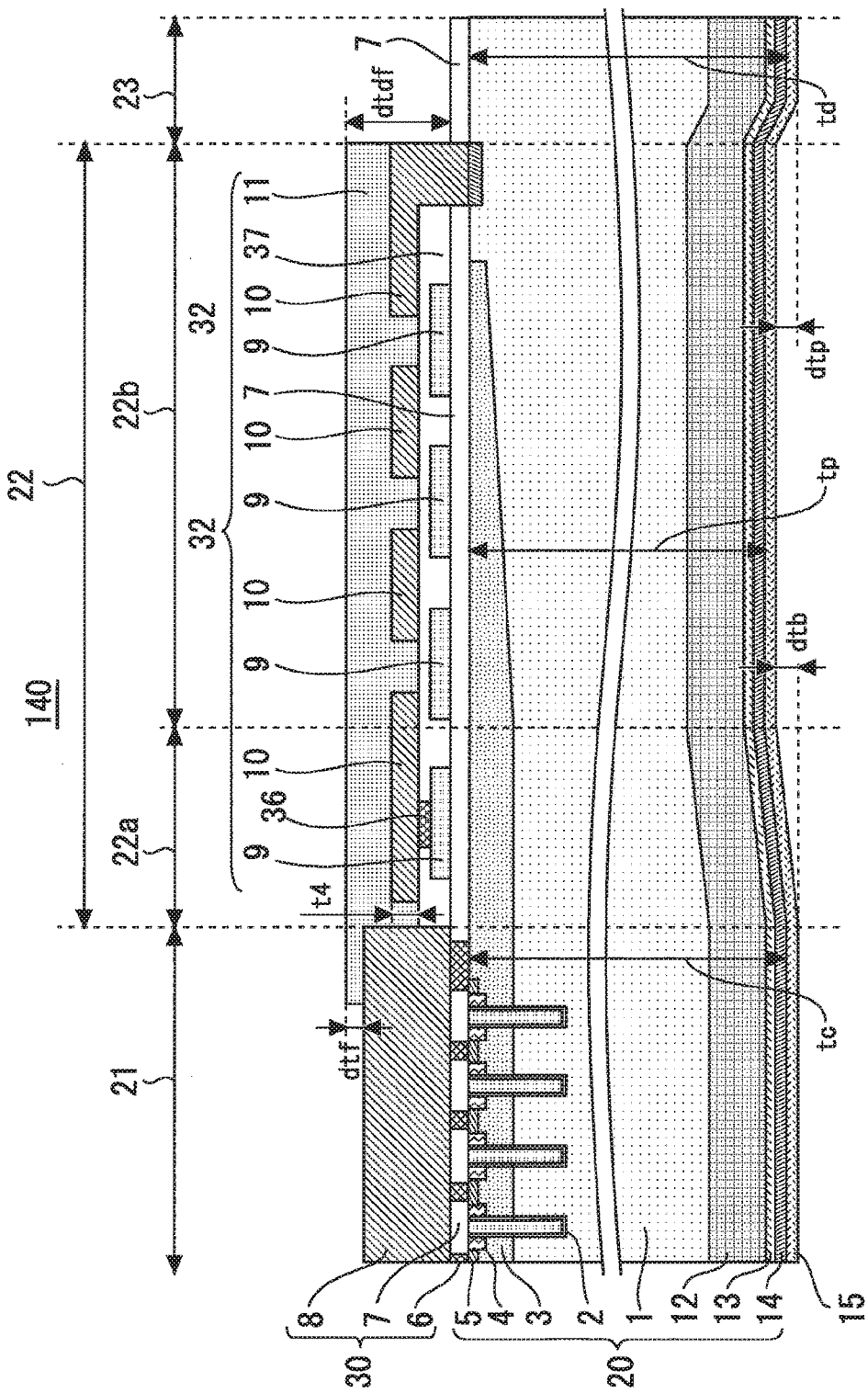
FIG. 11 is a cross-sectional view showing a structure of a semiconductor device according to a fourth embodiment.
Figure 12:
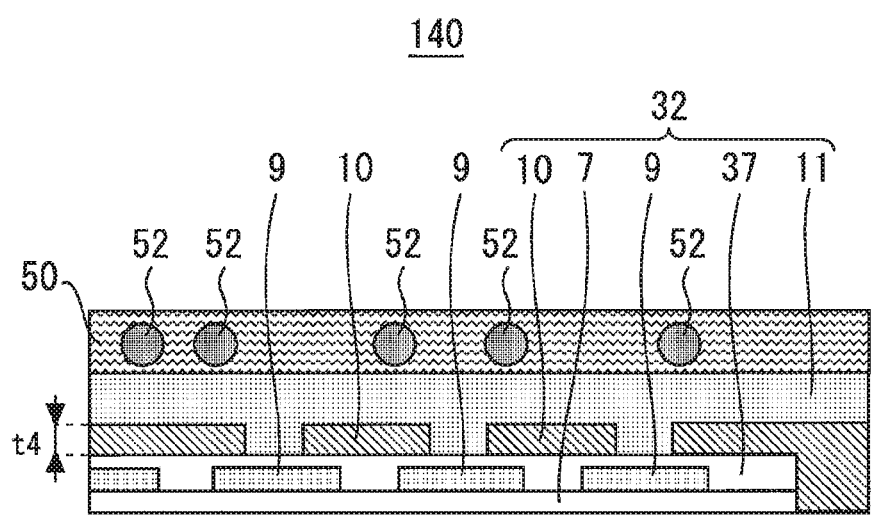
FIG. 12 is a cross-sectional view showing the structure after the semiconductor device according to the fourth embodiment is mounted.

FIG. 11 is a cross-sectional view showing a structure of a semiconductor device 140 according to a fourth embodiment. FIG. 12 is a cross-sectional view showing the structure after the semiconductor device 140 according to the fourth embodiment is mounted. As shown in FIG. 12, after the semiconductor device 140 is mounted, a scaling material 50 is provided on the peripheral edge surface structure portion 32. The sealing material 50 consists of an insulating material including fillers 52. In the semiconductor device 140, the thickness t4 of the second field plate electrodes 10 is determined in consideration of the relationship with the size of the fillers 52. Other configurations are the same as those in the first embodiment.

Specifically, in the fourth embodiment, the second field plate electrodes 10 are configured to be thinner than a predetermined reference particle diameter of the fillers 52 so as to suppress intrusion of the fillers 52 into inter-electrode gaps occurring between the plural second field plate electrodes 10. The diameter of the fillers 52 which are spherical fillers have a certain degree of variation, but falls into a range from not less than several pun to not more than several tens pun. In this diameter range, the diameters of the fillers 52 which may intrude into the gaps between the plural second field plate electrodes 10 are equal to about several μm. The "predetermined reference particle diameter" may be calculated based on the particle diameter specification of the fillers 52 as follows. A simple average value of particle diameters of the fillers 52 is referred to as "particle diameter simple average $D_{AVE}$", and σ represents a standard deviation of the particle diameters of the fillers 52. A value obtained by multiplying σ by a predetermined coefficient k is represented by kσ. The predetermined reference particle diameter is a value obtained by subtracting kσ from the particle diameter simple average $D_{AVE}$. It is preferable that the predetermined reference particle diameter is set to "$D_{AVE}-3σ$" by setting k to 3. The thickness t4 is designed to be smaller than the predetermined reference particle diameter. As a result, even when the fillers 52 having sufficiently smaller than the average particle size exist, it is possible to prevent such small diameter fillers 52 from intruding into the inter-electrode gaps.

Figure 13:
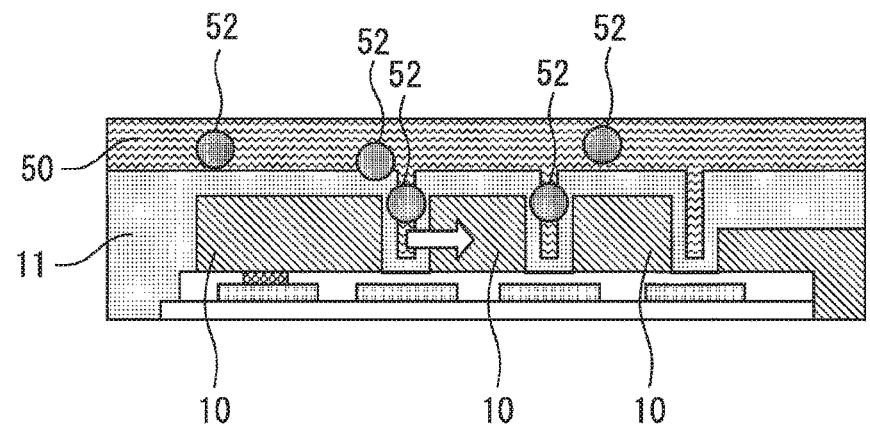
FIG. 13 is a diagram showing comparative examples relating to the present embodiment.
Figure 14:
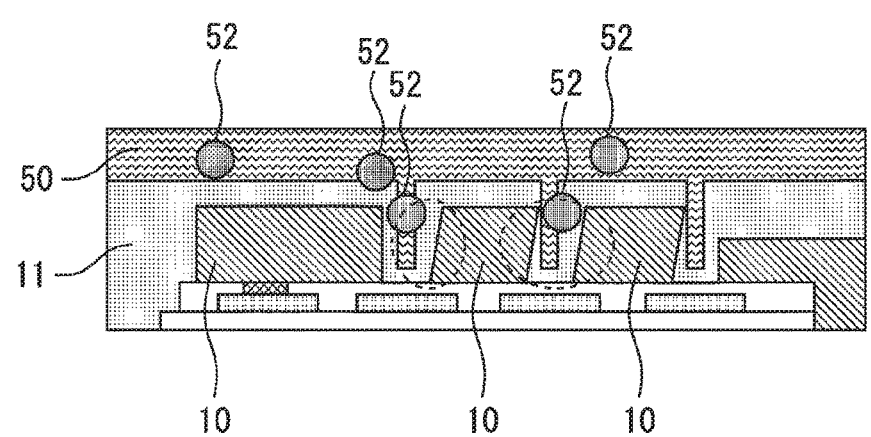
FIG. 14 is a diagram showing comparative examples relating to the present embodiment.

FIGS. 13 and 14 are diagrams showing comparative examples relating to the present embodiment. When the second field plate electrodes 10 are thick, a deep inter-electrode gap is formed between the adjacent second field plate electrodes 10. Due to the inter-electrode gaps, irregular gaps of the protective insulating film 11 are generated as shown in FIG. 13. As shown in FIG. 13, the fillers 52 of the sealing material 50 may intrude into the irregular gaps of the protective insulating film 11. The fillers 52 intruding into the irregular gaps apply force to the second field plate electrodes 10 in a direction indicated by an arrow in FIG. 13, whereby the second field plate electrodes 10 are deformed in a direction parallel to the plane direction of the semiconductor chip 20 as schematically shown in FIG. 14.

In this regard, according to the fourth embodiment, the intrusion of the fillers 52 as shown in FIG. 13 can be suppressed by suppressing the thickness t4 of the second field plate electrodes 10 so that the thickness t4 is sufficiently small. As a result, electrode deformation caused by the fillers 52 can be suppressed.

The fourth embodiment may be modified so that the upper surface of the first emitter electrode 8 is lower than the upper surfaces of the second field plate electrodes 10. In this case, after the thickness t4 of the second field plate electrodes 10 is suppressed, the first emitter electrode 8 is thinned so that the upper surface of the first emitter electrode 8 is further lower than the upper surfaces of the second field plate electrodes 10. Accordingly, it is preferable that the first emitter electrode 8 is thinned within a range which is allowable in consideration of an electric resistance value, etc. required to the first emitter electrode 8. In addition, the various modifications described with reference to the first embodiment may be applied to the fourth embodiment. Also, the fourth embodiment may be modified so that the cell surface electrode portion 30 includes the first emitter electrode 8 and the second emitter electrode 16 as in the case of the second embodiment. Furthermore, as in the case of the third embodiment, such a modification that the interlayer insulating film 7 in the cell portion 21 is replaced by the interlayer insulating film 17 as in the case of the third embodiment may be applied to the fourth embodiment.

Fifth Embodiment

Figure 15:
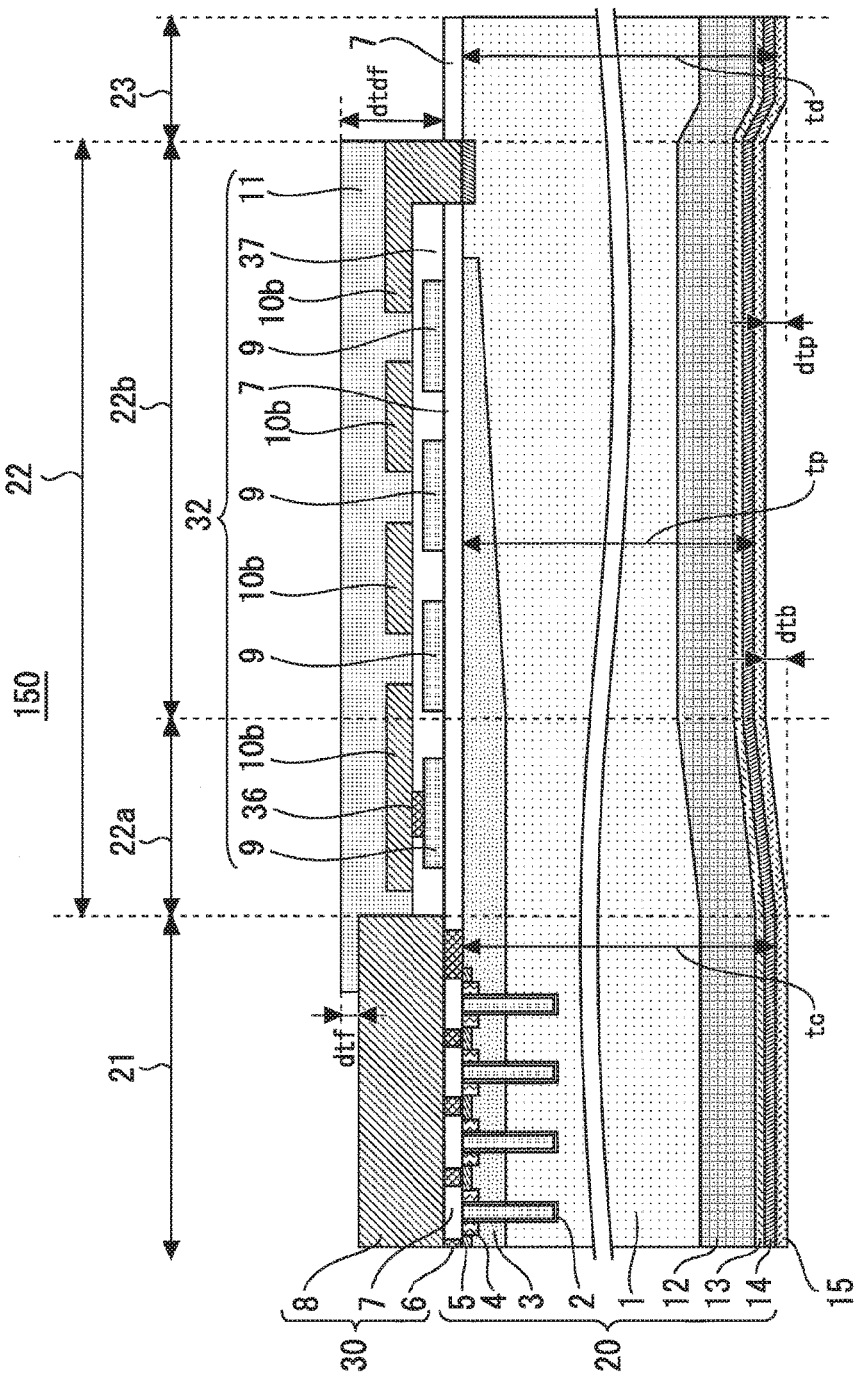
FIG. 15 is a cross-sectional view showing a structure of a semiconductor device according to a fifth embodiment.

FIG. 15 is a cross-sectional view showing a structure of a semiconductor device 150 according to a fifth embodiment. The semiconductor device 150 is different from the semiconductor device 140 according to the fourth embodiment in that the second field plate electrodes 10 are replaced by second field plate electrodes 10b. In the fourth embodiment, the first emitter electrode 8 and the second field plate electrodes 10 are formed of the same material, whereas they are formed of different materials in the fifth embodiment. The configurations other than described above are similar to those of the fourth embodiment.

The second field plate electrodes 10b are formed of a semi-insulating nitride film. By using the semi-insulating nitride film, corrosion of the second field plate electrodes 10b can be suppressed even when moisture infiltrates. As a result, the reliability of the semiconductor device 150 can be enhanced.

The semiconductor device 150 of the fifth embodiment is the same as that of the fourth embodiment in the configurations other than the second field plate electrodes 10b. However, the present invention is not limited to this configuration, and the second field plate electrodes 10 of each of the semiconductor devices 100 to 130 described with reference to the first to third embodiments may be replaced by the second field plate electrodes 10b according to the fifth embodiment.

Sixth Embodiment

Figure 16:
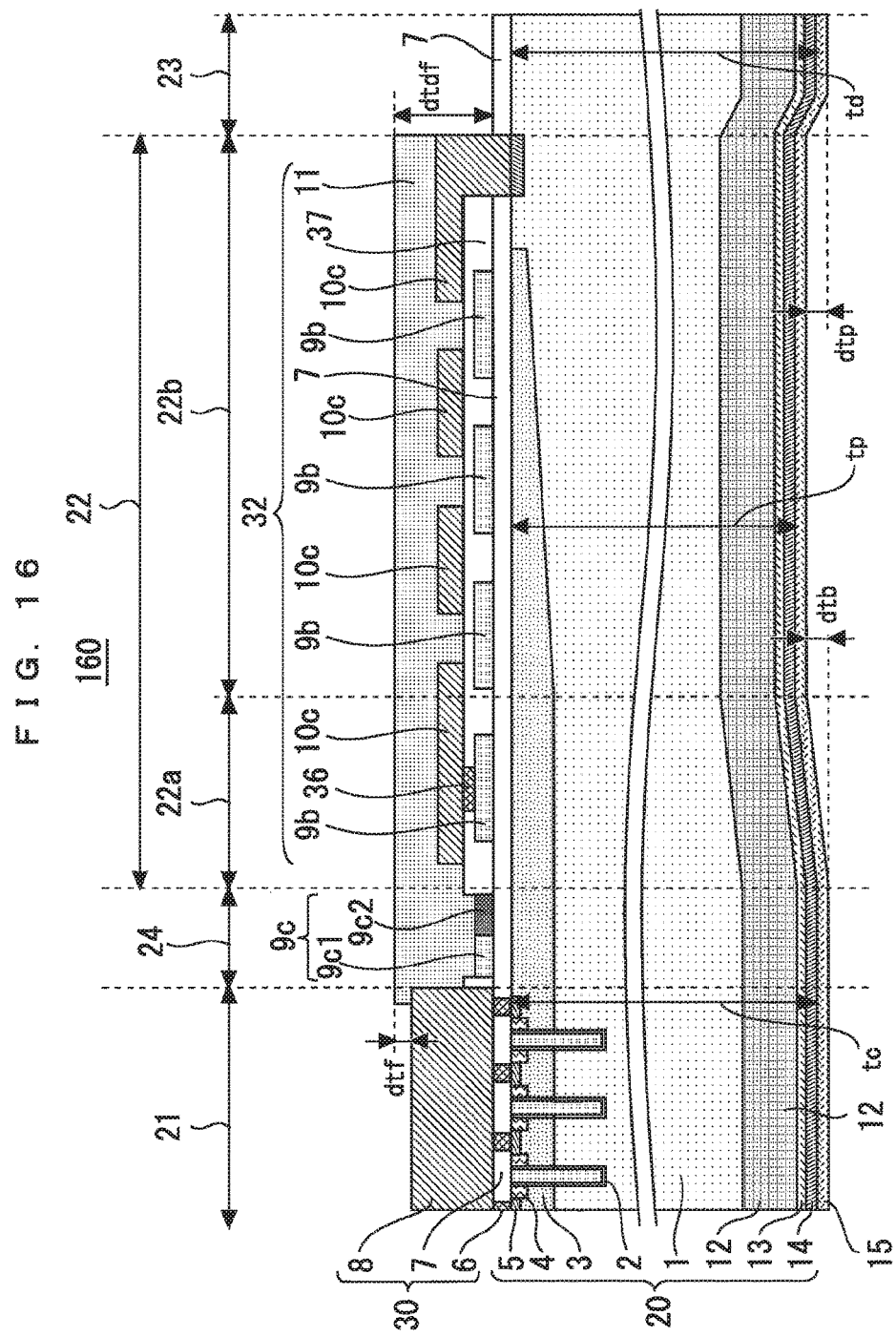
FIG. 16 is a cross-sectional view showing a structure of a semiconductor device according to a sixth embodiment.

FIG. 16 is a cross-sectional view showing a structure of a semiconductor device 160 according to a sixth embodiment. The semiconductor device 160 is different from the semiconductor device 150 according to the fifth embodiment in that the second field plate electrodes 10 are replaced by second field plate electrodes 10c. Furthermore, the semiconductor device 160 of the sixth embodiment is different from the semiconductor device 150 according to the fifth embodiment in that the semiconductor chip 20 further includes an inner peripheral boundary portion 24 and a temperature sensing diode 9c. The configurations other than described above are similar to those of the fifth embodiment. The second field plate electrodes 10c are formed of a polysilicon film. According to the sixth embodiment, corrosion of the second field plate electrodes 10c can be suppressed.

In the semiconductor device 160, the peripheral edge surface structure portion 32 includes first field plate electrodes 9b and second field plate electrodes 10c. Like the first field plate electrodes 9 according to the first embodiment, the first field plate electrodes 9b are formed of an n-type first polysilicon film. The second field plate electrodes 10c are formed of a second polysilicon film which is stacked in a step different from that of the first polysilicon film.

The semiconductor chip 20 includes the inner peripheral boundary portion 24 sandwiched between the cell portion 21 and the peripheral edge portion 22. The temperature sensing diode 9c is provided on the inner peripheral boundary portion 24. The temperature sensing diode 9c includes a first portion 9c1 formed of a first polysilicon film and a second portion 9c2 which is doped into a p-type. The temperature of the semiconductor chip 20 can be measured by measuring a forward voltage of the temperature sensing diode 9c.

A part of the second polysilicon film is used to form a gate pad 34, and another part of the second polysilicon film forms the second field plate electrodes 10c. Corrosion of the second field plate electrodes 10c can be suppressed by forming the second field plate electrodes 10c of polysilicon. Furthermore, a gate wire having a low resistance can be formed by forming the gate pad 34 of the second polysilicon film.

A first technical idea that the second field plate electrodes 10c are formed of the second polysilicon film and a second technical idea that the temperature sensing diode 9c is provided at the inner peripheral boundary portion 24 are included in the sixth embodiment. The first technical idea and the second technical idea may be implemented independently of each other. That is, in the sixth embodiment, the inner peripheral boundary portion 24 and the temperature sensing diode 9c may be omitted while the second field plate electrodes 10c are left. Alternatively, in the sixth embodiment, the second field plate electrodes 10c may be replaced by any of the second field plate electrodes 10 and 10b while the temperature sensing diode 9c is left at the inner peripheral boundary portion 24.

The semiconductor device 160 according to the sixth embodiment is the same as that of the fifth embodiment in the configurations other than the second field plate electrodes 10c and the inner peripheral boundary portion 24. However, each of the semiconductor devices 100 to 140 described with reference to the first to fourth embodiments may be modified so as to be provided with the second field plate electrodes 10c and the inner peripheral boundary portion 24 according to the sixth embodiment.

Seventh Embodiment

FIG. 17 is a flowchart showing a method of manufacturing a semiconductor device according to a seventh embodiment. According to the flowchart of FIG. 17, the semiconductor device 100 according to the first embodiment can be manufactured. In the flowchart of FIG. 17, a step of preparing a semiconductor wafer is first executed (step S100). "The front surface of the semiconductor wafer" and "the back surface of the semiconductor wafer" in the seventh embodiment correspond to "the front surface of the semiconductor chip 20" and "the back surface of the semiconductor chip 20" in the first embodiment", respectively after the semiconductor wafer is diced.

Next, an element forming step for forming a semiconductor active element in the cell portion 21 of the semiconductor wafer is executed (step S102). In this step, plural cell portions 21 are predetermined on the semiconductor wafer. Since plural semiconductor chips are generally manufactured from one semiconductor wafer, the plural cell portions 21 are set in a single semiconductor wafer so as to be arranged while spaced apart from one another in the plane direction of one semiconductor wafer. An element forming process of impurity implantation, etching, etc. is executed on each of the plural cell portions 21. As a result, as described with reference to FIG. 2, the base layer 3, the plural trench gates 2, the plural emitter layers 4, and the plural diffusion layers 5 are provided on the surface side of the semiconductor wafer. As described with reference to FIG. 2, the n-type first buffer layer 12, the n-type second buffer layer 13, and the collector layer 14 are provided on the back surface side of the semiconductor wafer. As a result, IGBT is formed in each of the cell portions 21.

Next, the surface structure of the semiconductor wafer is formed (step S104). Specifically, in this step, the cell surface electrode portion 30, the peripheral edge surface structure portion 32 and the gate pad 34 described with reference to the first embodiment are formed on the surface side of the semiconductor wafer. Here, the cell surface electrode portion 30 and the peripheral edge surface structure portion 32 are formed so that the front-surface level difference dtf satisfies the condition of the expression (2) described with reference to the first embodiment.

Next, a back surface grinding step is executed (step S106). In this step, thinning of the wafer is performed by grinding the back surface of the semiconductor wafer. When the back side of the semiconductor wafer is ground, specifically, the surface of the semiconductor wafer is first protected with a protective tape or the like. Next, the back surface of the semiconductor wafer is ground with a grinder. Irregularities on the surface of the semiconductor wafer cause variations in grinding depth of the back surface of the semiconductor wafer. The irregularities corresponding to the front-surface level difference dtf and the end portion front-surface level difference dtdf are transferred onto the back surface of the semiconductor wafer due to the variations in grinding depth. By this transfer of the irregularities, the first back-surface level difference dtb and the second back-surface level difference dtp are formed on the back surface of the semiconductor wafer as shown in FIG. 2 in the first embodiment.

The usefulness of back surface grinding for semiconductor wafers will be described. First, from the viewpoint of energy saving, IGBTs and diodes are used in a field of general-purpose inverters, AC servos or the like. The IGBT and the diode are used for a power module or the like for performing variable speed control of a three-phase motor or the like. In order to reduce inverter losses, devices each having low switching loss and on-voltage are required as IGBTs and diodes. The most part of the on-voltage is the resistance of the thick n-type base layer required to hold the withstand voltage. In order to reduce the resistance of the base layer, it is effective to thin the semiconductor wafer. By performing the back surface grinding step in the above step S106, a device having low switching loss and low on-resistance can be obtained.

Next, the collector electrode 15 is formed on the whole surface of the back surface of the semiconductor wafer (step S108).

Next, a dicing step is executed (step S110). In this step, the semiconductor wafer is diced along the dicing line portion 23 provided on the outer periphery of the peripheral edge portion 22. Specifically, dicing is performed on the dicing line portion 23 outside the peripheral edge portion 22 by a dicing blade or the like, whereby the semiconductor chip 20 is cut out from the semiconductor wafer. As a result, the semiconductor device 100 according to the first embodiment is manufactured. As the stacked film on the dicing line portion 23 is thinner, the wearing of the dicing blade can be suppressed more greatly. Accordingly, it is desirable not to form an electrode or a film such as the protective insulating film 11 on the dicing line portion 23. In this respect, in the seventh embodiment, as described on the structure of the first embodiment, only the interlayer insulating film 7 exists on the dicing line portion 23. Therefore, wearing of the dicing blade can be suppressed in step S110.

Next, a post-processing is executed (step S112). In this step, the semiconductor device 100 is mounted on a desired product. For example, the semiconductor device 100 may be packaged with a transfer molding resin material or the like, or may be mounted on a circuit board and accommodated in a case. The semiconductor device 100 may be used as a switching element of a power conversion device. Thereafter, the present manufacturing flow finishes.

According to the seventh embodiment described above, in step S104, the surface structure is formed so as to reduce dtf/tc to 1.5% or less, whereby the first back-surface level difference dtb transferred onto the back surface of the semiconductor wafer can be kept within the range satisfying the expression (1) of the first embodiment during the grinding of the back surface of the wafer in step S106. Current concentration on the cell portion 21 can be suppressed by suppressing the level difference to be transferred onto the back surface, so that the RBSOA resistance can be improved.

By modifying the manufacturing method according to the seventh embodiment, the semiconductor devices 110 to 150 according to the modification of the first embodiment and the second to fifth embodiments described above may be manufactured. For example, as a first modification of step S104, the second field plate electrodes 10 may be formed to be thinner than the first emitter electrodes 8, thereby forming the semiconductor device 110 shown in FIG. 8. As a second modification of step S104, the second emitter electrode 16 may be stacked on the first emitter electrode 8, thereby manufacturing the semiconductor device 120 shown in FIG. 9. As a third modification of step S104, the cell portion interlayer insulating film 17 having a large thickness may be provided on the cell portion 21, thereby manufacturing the semiconductor device 130 shown in FIG. 10. As a fourth modification of step S104, the thickness t4 of the second field plate electrodes 10 may be determined to be thin in relation to the predetermined reference particle diameter of the fillers 52, thereby manufacturing the semiconductor device 140 shown in FIG. 11. Furthermore, as a fifth modification of step S104, stacking and patterning of a semi-insulating nitride film may be performed on the upper layer insulating film 37 to provide the second field plate electrodes 10b, whereby the semiconductor device 150 shown in FIG. 15 is manufactured. Any two modifications of the foregoing first to fifth modifications may be simultaneously applied to step S104 as long as they do not conflict with each other.

Eighth Embodiment

Figure 18:
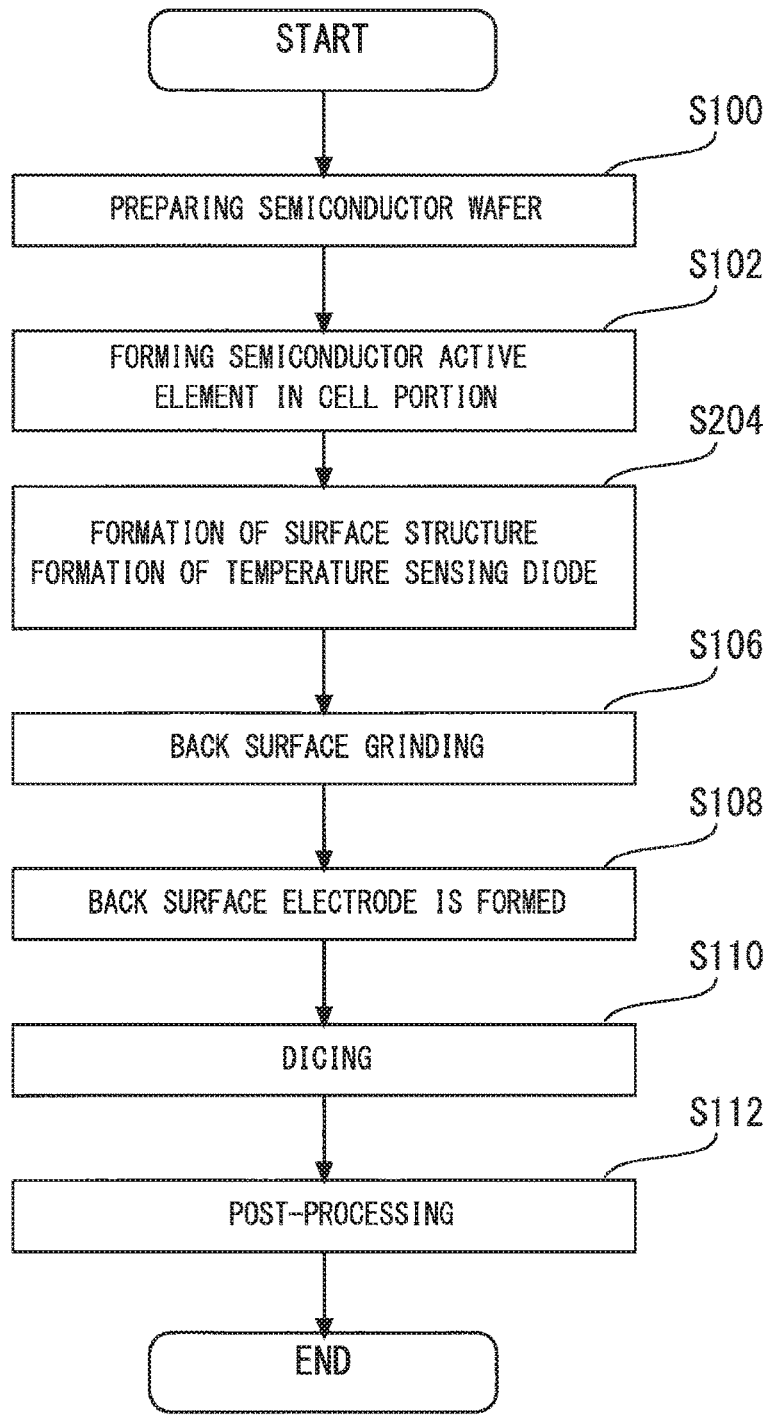
FIG. 18 is a flowchart showing a method of manufacturing a semiconductor device according to a eighth embodiment.

FIG. 18 is a flowchart showing a method of manufacturing a semiconductor device according to an eighth embodiment. In the flowchart of FIG. 18, the step S104 of FIG. 17 is replaced by step S204. Except for this point, the eighth embodiment is the same as the seventh embodiment. According to the eighth embodiment, the semiconductor device 160 according to the sixth embodiment can be manufactured. FIG. 16 will be referred to below as needed.

In the flowchart of FIG. 18, the processing of steps S100 and S102 are executed as in the case of the flowchart of FIG. 17. Next, formation of the temperature sensing diode as well as formation of the surface structure is performed (step S204). In step S204, as in the case of step S104 of the seventh embodiment, IGBT is formed in a pert of the cell portion 21 of the semiconductor wafer, and the cell surface electrode portion 30 is also formed after the formation of the IGBT. Furthermore, by performing stacking and patterning of the first polysilicon film on the peripheral edge portion 22, the first field plate electrodes 9b shown in FIG. 16 are formed. Here, the n-type first polysilicon film is also provided at the inner peripheral boundary portion 24. Subsequently, a pert of the first polysilicon film provided to the inner peripheral boundary portion 24, located on the side of the peripheral edge portion 22, is doped into a p-type, thereby forming the temperature sensing diode 9c shown in FIG. 16.

Subsequently, the upper layer insulating film 37 is stacked on the first field plate electrodes 9b. However, the upper layer insulating film 37 is not provided on an upper side of the temperature sensing diode 9c. Stacking and patterning of the second polysilicon film are performed on the upper layer insulating film 37 in the peripheral edge portion 22, whereby the second field plate electrodes 10c shown in FIG. 16 are provided. As a result, the peripheral edge surface structure portion 32 is formed.

The second polysilicon film for the second field plate electrodes 10c is also stacked on "another pert of the cell portion 21" on the surface of the semiconductor wafer. The gate pad 34 is formed by the second polysilicon film provided in "another part of the cell portion 21". That is, "another part of the cell portion 21" is a part where the gate pad 34 shown in plan view of FIG. 1 is formed. According to the above step, there is an advantage that the gate pad 34 and the second field plate electrodes 10c are simultaneously formed of the second polysilicon film stacked in step S204. It is also possible to simplify the process by simultaneous formation using polysilicon while compatibly performing both of corrosion suppression of the second field plate electrodes 10c and reduction of the resistance of control wiring for transmitting a control signal.

Thereafter, as in the case of the flowchart of FIG. 17, the steps S106 to SI 12 are executed, and the present manufacturing flow finishes. At least one of the first to fourth modifications of the above-described seventh embodiment may be applied to step S204 of the eighth embodiment.

Ninth Embodiment

Figure 19:
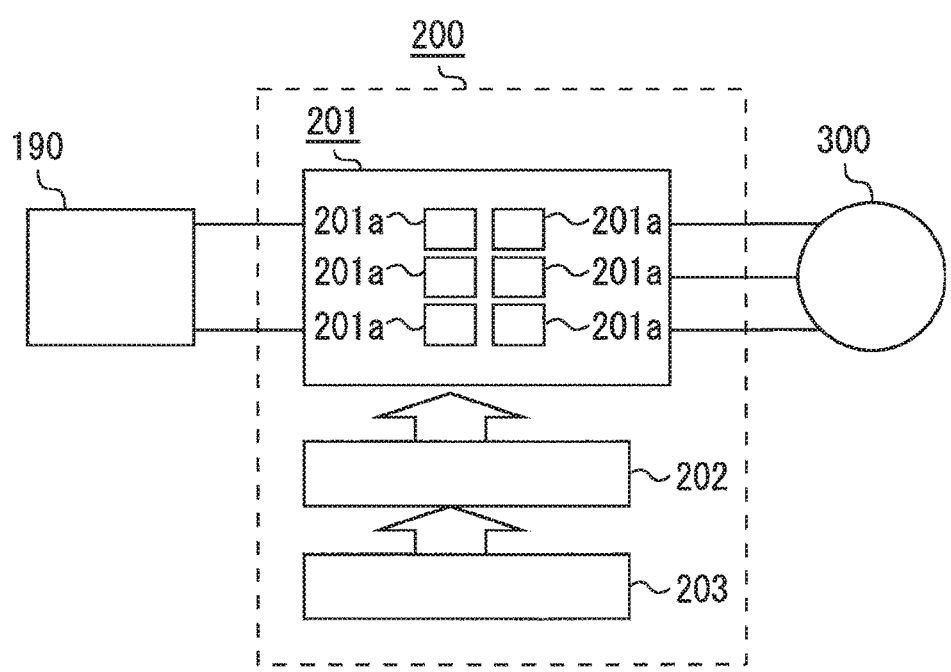
FIG. 19 is a block diagram showing a power conversion device according to a ninth embodiment.

FIG. 19 is a block diagram showing a power conversion device 200 according to a ninth embodiment. In the ninth embodiment, the power conversion device 200 includes at least one of the semiconductor devices 100 to 160 according to the foregoing first to sixth embodiments. The specific structure of the power conversion device 200 is not limited to a specific power conversion device. Hereinafter, an application to a three-phase inverter will be exemplified as the ninth embodiment.

FIG. 19 is a block diagram showing a configuration of a power conversion system to which the power conversion device 200 according to the ninth embodiment is applied.

The power conversion system shown in FIG. 19 includes a power supply 190, the power conversion device 200, and a load 300. The power supply 190 is a DC power supply and supplies DC power to the power conversion device 200. The power supply 190 can be configured by various types. The power supply 190 may be configured by, for example, a DC system, a solar battery, or a storage battery. The power supply 190 may be constituted by a rectifier circuit or an AC/DC converter connected to an AC system. Furthermore, the power supply 190 may be constituted by a DC/DC converter for converting DC power output from a DC system to predetermined electric power.

The power conversion device 200 is a three-phase inverter connected between the power supply 190 and the load 300. The power conversion device 200 converts DC power supplied from the power supply 190 into AC power and supplies AC power to the load 300. As shown in FIG. 19, the power conversion device 200 includes a main conversion circuit 201, a driving circuit 202, and a control circuit 203. The main conversion circuit 201 includes plural switching elements 201a. The main conversion circuit 201 converts DC power into AC power and outputs the AC power by switching operations of the plural switching elements 201a. The driving circuit 202 outputs a drive signal for driving each of the switching elements 201a. The control circuit 203 outputs a control signal for controlling the driving circuit 202 to the driving circuit 202.

The load 300 is a three-phase motor driven with AC power supplied from the power conversion device 200. The load 300 is not limited to a specific application. The load 300 is an electric motor to be mounted in various electric devices. The load 300 may be, for example, an electric motor used in a hybrid car, an electric car, a rail car, an elevator, or an air conditioner.

Hereinafter, details of the power conversion device 200 will be described. The main conversion circuit 201 includes a switching element 201a and a reflux diode (not shown). The main conversion circuit 201 converts the DC power supplied from the power supply 190 into AC power by the switching operations of the switching elements 201a, and supplies the AC power to the load 300.

Various configurations are available as a specific circuit configuration of the main conversion circuit 201. As an example, it is assumed that the main conversion circuit 201 according to the ninth embodiment is a two-level three-phase full-bridge circuit. The two-level three-phase full-bridge circuit may include six switching elements 201a and six reflux diodes (not shown) which are connected in anti-parallel to the switching elements 201a, respectively. Any one of the semiconductor devices 100 to 160 according to the first to sixth embodiments described above is applied to each of the switching elements 201a of the main conversion circuit 201. Respective two switching elements 201a are connected in series to constitute upper and lower arms. Each of the upper and lower arms constitutes each phase (U-phase, V-phase, W-phase) of the full-bridge circuit. The output terminals of the upper and lower arms correspond to three output terminals of the main conversion circuit 201, respectively. The three output terminals of the main conversion circuit 201 are connected to the load 300.

The driving circuit 202 generates a drive signal for driving each of the switching elements 201a, and supplies the drive signal to a control electrode of each of the switching elements 201a. The control electrode of the switching element 201a is the gate pad 34 of each of the semiconductor devices 100 to 160 according to the first to sixth embodiments. The driving circuit 202 outputs, to the control electrode of each switching element 201a, a drive signal for setting the switching element 201a to an ON-state and a drive signal for setting the switching element 201a to an OFF-state according to a control signal from a control circuit 203 described later. When the switching element 201a is maintained in the ON-state, the drive signal is a voltage signal that is equal to or higher than a threshold voltage of the switching element 201a. When the switching element 201a is maintained in the OFF-state, the drive signal is a voltage signal that is equal to or lower than the threshold voltage of the switching element 201a.

The control circuit 203 controls the switching element 201a of the main conversion circuit 201 such that desired power is supplied to the load 300. Specifically, a time (ON-time) at which each switching element 201a of the main conversion circuit 201 should be set to the ON-state is calculated based on power to be supplied to the load 300. For example, the main conversion circuit 201 can be controlled by PWM control for modulating the ON-time of the switching element 201a according to a voltage to be output. Then, a control command (control signal) is outputted to the driving circuit 202 so that an ON-signal is output to the switching element 201a to be set to the ON-state at each time point, and an OFF-signal is output to the switching element 201a to be set to the OFF-state at each time point. According to the control signal, the driving circuit 202 outputs the ON-signal or the OFF-signal as the drive signal to the control electrode of each switching element 201a.

In the power conversion device 200 according to the ninth embodiment, since any one of the semiconductor devices 100 to 160 according to the first to sixth embodiments is applied as the switching elements 201a of the main conversion circuit 201, the RBSOA resistance can be secured.

The two-level three-phase inverter is exemplified in the ninth embodiment, but a three-level or multi-level power conversion device may be used as a modification, or when power is supplied to a single-phase load, a single-phase inverter may be used. Furthermore, when power is supplied to a DC load or the like, it is also possible to apply to a DC/DC converter or an AC/DC converter.

Furthermore, a system in which the power conversion device 200 is used is not limited to the system in which the load 300 is an electric motor as described above. The power conversion device 200 may be used as a power supply device for, for example, an electric discharge machine, a laser processing machine, an induction heating cooker, or a contactless power supply system. The power conversion device 200 may be used as a power conditioner for a solar power generation system, a power storage system or the like.

The features and advantages of the present disclosure (or embodiments) may be summarized as follows. It is possible to keep the difference in thickness between the cell portion and the peripheral edge portion within a certain range so that the peripheral edge portion does not become excessively thin as compared with the cell portion in the semiconductor device having a back-surface level difference. Current concentration on the cell portion can be suppressed by suppressing the peripheral edge portion from becoming excessively thin as compared with the cell portion.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2018-033692, filed on Feb. 27, 2018 including specification, claims, drawings and summary, on which the Convention priority of the present application is based, is incorporated herein by reference in its entirety.

The invention claimed is:

1. A semiconductor device comprising:
   a semiconductor chip having a plane-body shape having a front surface and a back surface, and including a cell portion including the front surface and the back surface and provided in a central region in a plan view of the plane-body shape, and a peripheral edge portion including the front surface and the back surface and provided around the cell portion in the plan view of the plane-body shape;
   a cell surface electrode portion provided on the front surface of the cell portion; and
   a peripheral edge surface structure portion that is provided on the front surface of the peripheral edge portion and has a top surface higher than a top surface of the cell surface electrode portion, wherein
   the peripheral edge portion is made thinner than the cell portion so that the back surface of the peripheral edge portion is more concave than the back surface of the cell portion, and
   when a thickness of the cell portion is represented by tc and a level difference between the cell portion and the peripheral edge portion on the back surface is represented by dtb, $0\% < dtb/tc \leq 1.5\%$ is satisfied.

2. The semiconductor device according to claim 1, wherein the peripheral edge surface structure portion includes a peripheral edge electrode stacked above the front surface of the peripheral edge portion of the semiconductor chip, and a protective insulating film covering the peripheral edge electrode, and the protective insulating film covers an edge portion of the cell surface electrode portion.

3. The semiconductor device according to claim 1, wherein
   the semiconductor chip further includes a dicing line portion provided on an outer periphery of the peripheral edge portion in the plan view of the plane-body shape, the dicing line portion is made thicker than the peripheral edge portion so that a back surface of the dicing line portion protrudes more than the back surface of the peripheral edge portion, and
   when a thickness of the dicing line portion is represented by td and a level difference between the dicing line portion and the peripheral edge portion on the back surface is represented by dtp, $1.5\% \leq dtp/td$ is satisfied.

4. The semiconductor device according to claim 1, wherein
   the cell surface electrode portion includes
   an interlayer insulating film provided on the front surface of the cell portion,
   a contact portion penetrating through the interlayer insulating film, and
   a cell electrode that is provided on the interlayer insulating film and connected to the contact portion,
   the peripheral edge surface structure portion includes
   a peripheral edge electrode stacked above the front surface of the peripheral edge portion of the semiconductor chip, and
   a protective insulating film covering the peripheral edge electrode, and
   wherein an upper surface of the cell electrode is higher than an upper surface of the peripheral edge electrode.

5. The semiconductor device according to claim 1, wherein the cell surface electrode portion includes
   an interlayer insulating film provided on the front surface of the cell portion,
   a contact portion penetrating through the interlayer insulating film,
   a first cell electrode that is provided on the interlayer insulating film and connected to the contact portion, and
   a second cell electrode that is stacked on the first cell electrode and has a thermal resistance lower than that of the first cell electrode.

6. The semiconductor device according to claim 1, wherein
   the cell surface electrode portion includes
   a cell portion interlayer insulating film provided on the front surface of the cell portion,
   a cell contact portion penetrating through the cell portion interlayer insulating film, and
   a cell electrode that is provided on the cell portion interlayer insulating film and connected to the cell contact portion,
   the peripheral edge surface structure portion includes
   a peripheral edge portion insulating film provided above the front surface of the peripheral edge portion,
   a peripheral edge contact portion penetrating through the peripheral edge portion insulating film,
   a peripheral edge electrode that is stacked on the peripheral edge portion insulating film and connected to the peripheral edge contact portion, and
   a protective insulating film covering the peripheral edge electrode, and
   wherein the cell portion interlayer insulating film is made thicker than the peripheral edge portion insulating film.

7. The semiconductor device according to claim 1, wherein
   the peripheral edge surface structure portion includes
   a plurality of peripheral edge electrodes that are stacked above the front surface of the peripheral edge portion and spaced apart from one another in a plane direction of the front surface, and a protective insulating film covering the plurality of peripheral edge electrodes, the plurality of peripheral edge electrodes are made thinner than a predetermined reference particle diameter of fillers contained in a sealing material provided on the peripheral edge surface structure portion, and the predetermined reference particle diameter is predetermined by subtracting a multiplication value of a standard deviation of particle diameters of the fillers and a predetermined coefficient from a particle diameter simple average value of the fillers.

8. The semiconductor device according to claim 1, wherein the peripheral edge surface structure portion includes a peripheral edge electrode provided above the front surface of the peripheral edge portion, and the peripheral edge electrode is a semi-insulating nitride film.

9. The semiconductor device according to claim 1, wherein the peripheral edge surface structure portion includes a peripheral edge electrode provided above the front surface of the peripheral edge portion, and the peripheral edge electrode is a polysilicon film.

10. The semiconductor device according to claim 1, wherein
the semiconductor chip includes an inner peripheral boundary portion sandwiched between the cell portion and the peripheral edge portion,
the peripheral edge surface structure portion includes
a first peripheral edge electrode formed of a first polysilicon film having a first conductivity type,
an interlayer insulating film stacked on the first peripheral edge electrode, and
a second peripheral edge electrode stacked on the interlayer insulating film, and
wherein a temperature sensing diode is provided above the inner peripheral boundary portion, and the temperature sensing diode is formed of the first polysilicon film and partially doped into a second conductivity type.

11. A power conversion device comprising:
a main conversion circuit that includes a semiconductor device, converts input power by the semiconductor device and outputs the converted input power;
a driving circuit for outputting a drive signal for driving the semiconductor device to the semiconductor device; and
a control circuit for outputting a control signal for controlling the driving circuit to the driving circuit, wherein
the semiconductor device comprises
a semiconductor chip having a plane-body shape having a front surface and a back surface, and including a cell portion including the front surface and the back surface and provided in a central region in a plan view of the plane-body shape, and a peripheral edge portion including the front surface and the back surface and provided around the cell portion in the plan view of the plane-body shape,
a cell surface electrode portion provided on the front surface of the cell portion, and
a peripheral edge surface structure portion that is provided on the front surface of the peripheral edge portion and has a top surface higher than a top surface of the cell surface electrode portion, the peripheral edge portion is made thinner than the cell portion so that the back surface of the peripheral edge portion is more concave than the back surface of the cell portion, and when a thickness of the cell portion is represented by tc and a level difference between the cell portion and the peripheral edge portion on the back surface is represented by dtb, $0\% < dtb/tc \le 1.5\%$ is satisfied.

12. A semiconductor device manufacturing method comprising:
a preparing step of preparing a semiconductor wafer having a front surface and a back surface;
an element forming step of forming a semiconductor active element in a cell portion as a predetermined part in the semiconductor wafer;
a surface structure forming step of forming a cell surface electrode portion on a front surface of the cell portion after the semiconductor active element is formed, and forming a peripheral edge surface structure portion in a peripheral edge portion around the cell portion on the front surface of the semiconductor wafer so that the peripheral edge surface structure has a top surface higher than a top surface of the cell surface electrode portion, the cell surface electrode portion and the peripheral edge surface structure portion being formed so that $0\% < dtf/tc \le 1.5\%$ is satisfied when a thickness of the cell portion is represented by tc and a difference in height between the top surface of the cell surface electrode portion and the top surface of the peripheral edge surface structure portion is represented by dtf;
a back surface grinding step of performing wafer thinning of grinding the back surface of the semiconductor wafer after the cell surface electrode portion and the peripheral edge surface structure portion are formed, whereby a level difference occurring on the front surface due to the cell surface electrode portion and the peripheral edge surface structure portion is transferred onto the back surface of the peripheral edge portion; and
a dicing step of dicing the semiconductor wafer along a dicing line provided on an outer periphery of the peripheral edge portion after performing the wafer thinning.

13. The semiconductor device manufacturing method according to claim 12, wherein the surface structure forming step comprises:
a step of forming the semiconductor active element in a part of the cell portion on the front surface of the semiconductor wafer;
a step of forming a control electrode pad connected to a control electrode of the semiconductor active element at another part of the cell portion on the front surface of the semiconductor wafer; and
a step of providing the peripheral edge portion with a first field plate electrode, an interlayer insulating film stacked on the first field plate electrode, and a second field plate electrode stacked on the interlayer insulating film, thereby forming the peripheral edge surface structure portion, and wherein the control electrode pad and the second field plate electrode are formed of polysilicon stacked in the same step.

* * * * *